(12) United States Patent
Nozaki et al.

(10) Patent No.: US 9,006,778 B2
(45) Date of Patent: Apr. 14, 2015

(54) NITRIDE SEMICONDUCTOR LIGHT EMITTING DEVICE AND METHOD OF MANUFACTURING THE SAME

(71) Applicant: Panasonic Corporation, Osaka (JP)

(72) Inventors: Shinichiro Nozaki, Kyoto (JP); Toshiyuki Takizawa, Kyoto (JP); Kazuhiko Yamanaka, Osaka (JP)

(73) Assignee: Panasonic Intellectual Property Mangement Co., Ltd., Osaka (JP)

( * ) Notice: Subject to any disclaimer, the term of this patent is extended or adjusted under 35 U.S.C. 154(b) by 297 days.

(21) Appl. No.: 13/675,929

(22) Filed: Nov. 13, 2012

(65) Prior Publication Data

US 2013/0069107 A1 Mar. 21, 2013

Related U.S. Application Data

(63) Continuation of application No. PCT/JP2011/002535, filed on May 2, 2011.

(30) Foreign Application Priority Data

May 20, 2010 (JP) .................................. 2010-116797
May 28, 2010 (JP) .................................. 2010-123437

(51) Int. Cl.
*H01L 33/00* (2010.01)
*H01L 33/22* (2010.01)
(Continued)

(52) U.S. Cl.
CPC .............. *H01L 33/22* (2013.01); *H01S 5/0207* (2013.01); *H01S 5/3203* (2013.01); *H01S 5/32341* (2013.01); *H01S 2301/173* (2013.01); *H01S 5/021* (2013.01); *H01S 5/4031* (2013.01)

(58) Field of Classification Search
CPC ......... H01L 33/20; H01L 33/22; H01L 33/24; H01S 5/3203; H01S 2301/173
USPC ................... 257/79, 103, E33.001, E33.002, 257/E33.005, E33.006, E33.055; 438/22, 438/39–41, 46
See application file for complete search history.

(56) References Cited

U.S. PATENT DOCUMENTS 4,099,305 A * 7/1978 Cho et al. ......................... 438/40
4,546,479 A * 10/1985 Ishikawa et al. ............ 372/45.01
(Continued)

FOREIGN PATENT DOCUMENTS

JP 61-019186 1/1986
JP 05-082834 4/1993
(Continued)

OTHER PUBLICATIONS

Machine translation, Shinohara, Japanese Patent Publication No. JP-2010-103578 (translation date: Oct. 29, 2014), JPO & Japio, all pages.*

(Continued)

*Primary Examiner* — Fernando L Toledo
*Assistant Examiner* — Victoria K Hall
(74) *Attorney, Agent, or Firm* — McDermott Will & Emery LLP

(57) ABSTRACT

A nitride semiconductor light emitting device includes: an uneven substrate having an uneven structure in which recesses are formed; a first nitride semiconductor layer of a first conductive type formed on the uneven structure; a first light emitting layer formed on the first nitride semiconductor layer; and a second nitride semiconductor layer of a second conductive type formed on the light emitting layer, wherein each protrusion has a bottom made of a material or composition having a thermal expansion coefficient larger than the thermal expansion coefficient of the material or composition of the first nitride semiconductor layer.

19 Claims, 20 Drawing Sheets

(51) Int. Cl.
  H01S 5/32 (2006.01)
  H01S 5/323 (2006.01)
  H01S 5/02 (2006.01)
  H01S 5/40 (2006.01)

(56) References Cited

U.S. PATENT DOCUMENTS

| | | | |
|---|---|---|---|
| 6,074,936 A * | 6/2000 | Ro et al. | 438/504 |
| 6,130,107 A * | 10/2000 | Brady et al. | 438/22 |
| 6,576,533 B2 | 6/2003 | Tomiya et al. | 438/481 |
| 6,635,901 B2 * | 10/2003 | Sawaki et al. | 257/80 |
| 6,844,572 B2 * | 1/2005 | Sawaki et al. | 257/94 |
| 6,861,672 B2 * | 3/2005 | Kamiyama et al. | 257/79 |
| 6,888,867 B2 * | 5/2005 | Sawaki et al. | 372/46.01 |
| 7,154,125 B2 * | 12/2006 | Koide et al. | 257/95 |
| 7,368,763 B2 * | 5/2008 | Miura et al. | 257/190 |
| 7,939,349 B2 * | 5/2011 | Koide et al. | 438/22 |
| 7,956,370 B2 * | 6/2011 | Pan | 257/95 |
| 7,982,205 B2 * | 7/2011 | Wang | 257/13 |
| 8,134,169 B2 * | 3/2012 | Yu et al. | 257/94 |
| 8,138,510 B2 * | 3/2012 | Tak et al. | 257/94 |
| 8,183,557 B2 * | 5/2012 | Iza et al. | 257/22 |
| 8,217,418 B1 * | 7/2012 | Pan et al. | 257/103 |
| 8,242,510 B2 * | 8/2012 | Hebert | 257/76 |
| 8,426,887 B2 * | 4/2013 | Son | 257/103 |
| 8,536,594 B2 * | 9/2013 | Odnoblyudov | 257/91 |
| 8,658,450 B2 * | 2/2014 | Nago et al. | 438/46 |
| 8,674,381 B2 * | 3/2014 | Sakamoto et al. | 257/91 |
| 2002/0014622 A1 * | 2/2002 | Shimoyama et al. | 257/14 |
| 2002/0074561 A1 | 6/2002 | Sawaki et al. | |
| 2003/0031219 A1 | 2/2003 | Sawaki et al. | |
| 2003/0178702 A1 | 9/2003 | Sawaki et al. | |
| 2004/0113166 A1 * | 6/2004 | Tadatomo et al. | 257/98 |
| 2007/0228395 A1 * | 10/2007 | Kamiyama et al. | 257/79 |
| 2008/0283846 A1 * | 11/2008 | Ohmae et al. | 257/79 |
| 2009/0032799 A1 * | 2/2009 | Pan | 257/13 |
| 2009/0159924 A1 * | 6/2009 | Kamiyama et al. | 257/103 |
| 2009/0298212 A1 * | 12/2009 | Pan | 438/42 |
| 2010/0025684 A1 | 2/2010 | Shinohara et al. | |
| 2010/0140653 A1 * | 6/2010 | Lin et al. | 257/98 |
| 2010/0203662 A1 * | 8/2010 | Pan | 438/29 |
| 2011/0018009 A1 * | 1/2011 | Krumaccher et al. | 257/88 |
| 2011/0101502 A1 * | 5/2011 | Wang | 257/615 |
| 2011/0180828 A1 * | 7/2011 | Rana et al. | 257/97 |

FOREIGN PATENT DOCUMENTS

| | | |
|---|---|---|
| JP | 2002-246646 A | 8/2002 |
| JP | 2003-347585 A | 12/2003 |
| JP | 2005-311034 A | 11/2005 |
| JP | 2010-103578 A | 5/2010 |
| JP | 2010-109147 A | 5/2010 |

OTHER PUBLICATIONS

International Search Report issued in International Patent Application PCT/JP2011/002535 dated Jul. 5, 2011.

Funato, M. et al. "Monolithic Polychromatic Light-Emitting Diodes Based on InGaN Microfacet Quantum Wells Toward Tailor-Made Solid-State Lighting". The Japan Society of Applied Physics. pp. 1-3. Jan. 17, 2008.

Hikosaka, T. et al. "Optical and Electrical Properties of (1-101)GaN Grown on a 7° Off-Axis (001)Si Substrate". American Institute of Physics. vol. 84, No. 23, Jun. 7, 2004.

* cited by examiner

NITRIDE SEMICONDUCTOR LIGHT EMITTING DEVICE AND METHOD OF MANUFACTURING THE SAME

CROSS REFERENCE TO RELATED APPLICATIONS

This is a continuation application of PCT Patent Application No. PCT/JP2011/002535 filed on May 2, 2011, designating the United States of America, which is based on and claims priority of Japanese Patent Applications No. 2010-116797 filed on May 20, 2010 and No. 2010-123437 filed on May 28, 2010. The entire disclosures of the above-identified applications, including the specifications, drawings and claims are incorporated herein by reference in their entirety.

FIELD

The present invention relates to nitride semiconductor light emitting devices and methods of manufacturing the same.

BACKGROUND

Recently, white light emitting diode (LED) light sources including an LED have been actively studied as white light sources such as light sources for lighting apparatuses and back light sources for liquid crystal display apparatuses. An exemplary white LED light source is composed of a blue LED which emits blue light and a phosphor which converts the blue light from the blue LED into yellow light. Actively being studied blue LEDs are especially nitride semiconductor light emitting devices including a wide band gap semiconductor such as a nitride semiconductor.

In most blue LEDs in use, a light emitting layer which recombines electrons and holes and thereby emits light is formed on a crystal plane called a (0001) plane (a c-plane, a polar plane) composed of nitride semiconductor crystals. However, a light emitting layer formed on the c-plane causes polarization in the light emitting layer due to the difference in lattice constant between materials used therein. This polarization causes the problem that an internal electric field called a piezoelectric field generated in the light emitting layer spatially separates the electrons and holes, resulting in reduction in the light emission efficiency.

In order to solve this problem, trials have been conducted which are for reducing such influence of piezoelectric fields by forming a light emitting layer on a plane (non-polar plane) tilted with respect to the c-plane. However, such a non-polar plane has not yet been in practical use because of the need of large openings and high dislocation density. Examples of conventionally proposed blue LEDs including a non-polar plane include a nitride semiconductor light emitting device disclosed in Patent Literature (PTL) 1.

With reference to FIG. 18, the conventional method of manufacturing a nitride semiconductor light emitting device is described below. FIG. 18 shows schematic cross-sectional views of a conventional nitride semiconductor light emitting device in processes of a conventional manufacturing method.

As shown in (a) of FIG. 18, one of a silicon oxide film and a silicon nitride film is formed on a silicon substrate 1 which is oriented off by seven degrees from a (100) silicon plane, and a mask 52 which has stripe-shaped openings is formed using a photolithography method or a dry etching method.

Next, as shown in (b) of FIG. 18, wet etching potassium hydroxide (KOH), tetramethylammonium hydroxide (TMAH), or the like is performed on the silicon substrate 1 with the mask 52 formed thereon, so as to transform the silicon substrate 1 to have an uneven structure in which cuts having a triangle cross-section are formed at positions corresponding to the openings in the mask 52. At this time, slope faces in protrusions (recesses) in the uneven structure are facet faces 61 of the (111) silicon plane.

Next, as shown in (c) of FIG. 18, a mask 53 which is a silicon oxide film or a silicon nitride film is formed to cover one of two slope faces in each of the protrusions (recesses) using a sputtering method or a vacuum evaporation method.

Next, as shown in (d) of FIG. 18, a nitride semiconductor crystal is grown on the silicon substrate 1 using a Metal Organic Chemical Vapor Deposition (MOCVD) method, and a crystalline nitride semiconductor 2 is grown on only on each (111) silicon facet face 61 which is not covered by any of the masks 52 and 53. The crystalline nitride semiconductor 2 on each facet face 61 is grown in the growth direction to be a (1-101) facet face 70 in the nitride semiconductor 2.

This crystal growth further continues, and as shown in (e) to (g) of FIG. 18, nitride semiconductors 2 grown from the side faces of adjacent ones of the protrusions (recesses) are combined with each other, in other words, the (1-101) facet faces 70 in the nitride semiconductor 2 are combined to be the continuous (1-101) plane in the final nitride semiconductor 2.

Next, an n-type semiconductor layer, a light emitting layer, and a p-type semiconductor layer are formed on the crystalline nitride semiconductor generated in the above-describe manner. In this way, it is possible to manufacture a conventional nitride semiconductor light emitting device (not shown).

CITATION LIST

Patent Literature

[PTL 1]
Japanese Unexamined Patent Application Publication No. 2002-246646.

SUMMARY

Technical Problem

However, the aforementioned conventional nitride semiconductor light emitting device has a problem indicated below.

The conventional nitride semiconductor light emitting device has a large difference in the coefficient of thermal expansion between a silicon (Si) substrate and a nitride semiconductor. Thus, tensile stress is applied to the nitride semiconductor in the crystal growth process, which often results in cracks in the nitride semiconductor.

In addition, in the case of a conventional nitride semiconductor light emitting device, alkaline wet etching for forming an uneven structure on a silicon substrate yields a comparatively high etching rate for planes other than a silicon (111) plane. For this reason, it is impossible to form a silicon substrate having an uneven structure in which recesses and protrusions are arranged at very regular intervals, and thus it is impossible to form a nitride semiconductor having high in-plane uniformity.

The present invention has been conceived to solve the aforementioned problems, with an aim to reduce the possibility that cracks occur in the nitride semiconductor layers of a nitride semiconductor device and provide a nitride semiconductor light emitting device including the nitride semiconductor device having high in-plane uniformity.

Solution to Problem

In order to solve the aforementioned problems, the nitride semiconductor light emitting device according to an aspect of the present invention includes a nitride semiconductor light emitting device including: an uneven substrate having an uneven structure in which a recess is formed; a first nitride semiconductor layer of a first conductive type formed on the uneven structure; a first light emitting layer formed on the first nitride semiconductor layer; and a second nitride semiconductor layer of a second conductive type formed on the first light emitting layer, the second conductive type being different from the first conductive type, wherein the recess has a bottom having a heat expansion coefficient larger than a heat expansion coefficient of the first nitride semiconductor layer.

With this, it is possible to reduce stress strain in the first nitride semiconductor layer due to the difference in the thermal expansion coefficients between recesses of the uneven structure in the uneven substrate and the first nitride semiconductor layer. Accordingly, it is possible to reduce the possibility that cracks occur in the first nitride semiconductor layer.

In addition, in the nitride semiconductor light emitting device according to the aspect of the present invention, the uneven substrate may include a first substrate comprising silicon, an insulating layer formed on the first substrate, and a second substrate comprising silicon formed on the insulating layer, the recess may be an opening formed in the second substrate such that the bottom of the recess is part of a surface of the insulating layer, and the recess may have a side surface having a plane direction different from a plane direction of a main surface of the second substrate.

With this, it is possible to reduce resilient stress in the first nitride semiconductor layer due to the difference in the thermal expansion coefficients between the first substrate made of silicon and the first nitride semiconductor layer. Accordingly, it is possible to reduce the possibility that cracks occur in the first nitride semiconductor layer.

Furthermore, it is possible to control the depth of the recesses of the second substrate by controlling the thickness of the second substrate. Accordingly, it is possible to reduce the contact area between the second substrate and the first nitride semiconductor layer, by controlling the thickness of the second substrate to have shallow recesses. As a result, it is possible to further reduce the resilience stress to be applied to the first nitride semiconductor layer, and to thereby further reduce the possibility that cracks occur in the first nitride semiconductor layer.

Since the first substrate, the insulating layer, and the second substrate are stacked, the insulating layer can function as an etching stop layer when the uneven structure is formed in the second substrate. In this way, it is possible to form the uneven structure having high in-plane uniformity in the second substrate, and to thereby form each of the nitride semiconductor layers having high in-plane uniformity above the uneven structure, especially the first nitride semiconductor layer having high in-plane uniformity on the uneven structure.

Furthermore, preferably in the nitride semiconductor light emitting device according to the aspect of the present invention, the side surface of the recess should be a (111) silicon plane.

In this case, a crystalline (0001) gallium nitride plane can be grown on the (111) silicon plane.

Furthermore, preferably in the nitride semiconductor light emitting device according to the aspect of the present invention, the main surface of the second substrate should be one of (i) a seven-degree off-oriented plane which is oriented off by seven degrees from a (100) silicon plane, (ii) a (311) silicon plane, and (iii) a (110) silicon plane, and (iv) a (112) silicon plane.

In this way, the main surface of the nitride semiconductor layer of the first conductive type is one of the (1-101) plane, the (11-22) plane, the (1-100) plane, and the (11-20) plane each made of gallium nitride, and thus it is possible to reduce the piezoelectric field that occur in the light emitting layer. As a result, it is possible to achieve the nitride semiconductor light emitting device having high light emission efficiency.

Furthermore, preferably in the nitride semiconductor light emitting device according to the aspect of the present invention, the first nitride semiconductor layer should have a planar top surface.

In this way, it is possible to easily form various kinds of semiconductor layers on the planar surface using general semiconductor manufacturing processes. Furthermore, it is possible to form, on the planar surface, a semiconductor layer also having a planar surface, and thus to easily form a recess-protrusion pattern or the like for increasing the light extraction efficiency. As a result, it is possible to achieve the nitride semiconductor light emitting device having high light emission efficiency.

Furthermore, preferably in the nitride semiconductor light emitting device according to the aspect of the present invention, the first substrate should have a main surface which is a (100) silicon plane.

In this case, the main surface of the first substrate is a (100) silicon plane having a cleavage property, and thus it is possible to easily cleave a first substrate into nitride semiconductor light emitting devices.

Furthermore, in the nitride semiconductor light emitting device according to the aspect of the present invention, the uneven substrate may have a first area having the uneven structure and a second area having a planar surface, a first nitride semiconductor stack may be formed on the first area, the first nitride semiconductor stack including the first nitride semiconductor layer, the first light emitting layer, and the second nitride semiconductor layer, a second nitride semiconductor stack may be formed on the second area, the second nitride semiconductor stack including a third nitride semiconductor layer of the first conductive type, a second light emitting layer, and a fourth nitride semiconductor layer of the second conductive type, the second nitride semiconductor stack may have a main surface whose plane direction is different from a plane direction of a main surface of the first nitride semiconductor stack, and the second light emitting layer may emit light having a wavelength longer than a wavelength of light emitted from the first light emitting layer.

With this, the nitride semiconductor layers having different plane directions can grow planar and parallel to the main surface of the uneven structure. In this way, it is possible to easily form fine electrodes and recess-protrusion patterns using general semiconductor manufacturing processes. In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Furthermore, preferably in the nitride semiconductor light emitting device according to the aspect of the present invention, the first area and the second area should be separated by an insulating layer.

In this case, it is possible to use different substrates for the first area and the second area, and to thereby easily grow nitride semiconductor crystals having different plane directions. In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Furthermore, preferably in the nitride semiconductor light emitting device according to the aspect of the present invention, each of the first area and the second area should comprise a silicon single crystal.

In this case, nitride semiconductor crystals having different plane directions can easily be grown. In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Furthermore, preferably in the nitride semiconductor light emitting device according to the aspect of the present invention, a protrusion in the uneven structure in the first area should have at least two side surfaces, one of the at least two side surfaces of the protrusion should be a (100) silicon plane, and the other side surface of the protrusion should be covered with a predetermined mask.

In this case, the first nitride semiconductor layer grows planar, which makes it possible to easily form fine electrodes and a recess-protrusion pattern using general semiconductor manufacturing processes. In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Furthermore, in the nitride semiconductor light emitting device according to the aspect of the present invention, the uneven substrate may be a sapphire substrate having a main surface which is a (11-20) plane.

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Furthermore, preferably in the nitride semiconductor light emitting device according to the aspect of the present invention, at least one of the second nitride semiconductor layer and the fourth nitride semiconductor layer should include an uneven structure.

In this case, since the light emitting surface having a uneven structure is formed, it is possible to efficiently extract light from the first nitride semiconductor layer or the second nitride semiconductor layer.

Furthermore, preferably, the nitride semiconductor light emitting device according to the aspect of the present invention should further include a third nitride semiconductor stack formed on the uneven substrate, the third nitride semiconductor stack including a fifth nitride semiconductor layer of the first conductive type, a third light emitting layer, and a sixth nitride semiconductor layer of the second conductive type, wherein the third light emitting layer emits light having a wavelength different from wavelengths of light emitted from the first light emitting layer and light emitted from the second light emitting layer.

In this case, it is possible to realize the semiconductor light emitting device which emits light beams of three wavelengths.

Furthermore, preferably in the nitride semiconductor light emitting device according to the aspect of the present invention, the uneven substrate should have, as the uneven structure, a periodic structure in which recesses and protrusions are arranged at regular intervals.

In this case, the uneven structure makes it possible to extract light emitted from the first light emitting layer. In this way, it is possible to achieve a nitride semiconductor light emitting device having high light emission efficiency.

A method of manufacturing a nitride semiconductor light emitting device, according to an aspect of the present invention, the method including: forming an uneven substrate having an uneven structure in which a recess is formed; forming a first nitride semiconductor layer of a first conductive type on the uneven structure; forming a first light emitting layer on the first nitride semiconductor layer; and forming a second nitride semiconductor layer of a second conductive type on the light emitting layer, the second conductive type being different from the first conductive type, wherein the recess has a bottom having a heat expansion coefficient larger than a heat expansion coefficient of the first nitride semiconductor layer.

With this, it is possible to reduce resilient stress in the first nitride semiconductor layer due to the difference in the thermal expansion coefficients between recesses of the uneven structure in the uneven substrate and the first nitride semiconductor layer. Accordingly, it is possible to reduce the possibility that cracks occur in the first nitride semiconductor layer.

Furthermore, in the nitride semiconductor light emitting method according to the aspect of the present invention, the forming of an uneven substrate may include: forming, on a first substrate comprising silicon, (i) an insulating layer part of which is a bottom of the recess and (ii) a second substrate comprising silicon; and forming the recess having a side surface whose plane direction is different from a plane direction of a main surface of the second substrate, by partly removing the second substrate to expose the insulating layer; and forming, in the forming of a first nitride semiconductor layer, the first nitride semiconductor layer on the side surface of the recess.

With this, it is possible to reduce resilient stress in the first nitride semiconductor layer due to the difference in the thermal expansion coefficients between the first substrate and the first nitride semiconductor layer. Furthermore, it is possible to control the depth of the recesses in the uneven structure of the second substrate by controlling the thickness of the second substrate. Accordingly, it is possible to reduce the possibility that cracks occur in the first nitride semiconductor layer.

Furthermore, the insulating layer can function as an etching stop layer when the uneven structure is formed in the second substrate, which makes it possible to form the nitride semiconductor layer having a high in-plane uniformity on the uneven structure.

Furthermore, preferably in the nitride semiconductor light emitting method according to the aspect of the present invention, the side surface of the recess should be a (111) silicon plane.

In this case, a crystalline (0001) gallium nitride plane can be grown on the (111) silicon plane.

Furthermore, preferably the nitride semiconductor light emitting method according to the aspect of the present invention should further include: bonding a third substrate to the second nitride semiconductor layer; and removing the first substrate, the insulating layer, and the second substrate.

In this case, it is possible to form, on the third substrate, the first nitride semiconductor layer having the uneven surface. In this way, it is possible to achieve a nitride semiconductor light emitting device having high light emission efficiency.

Furthermore, preferably in the nitride semiconductor light emitting method according to the aspect of the present invention, the forming of an uneven substrate should include: forming, on a first substrate comprising a silicon single crystal, (i) an insulating layer and (ii) a second substrate comprising a silicon single crystal and having a main surface whose plane direction is different from a plane direction of a (111) silicon plane; and forming a protrusion having a first side surface which is the (111) silicon plane, by partly removing the second substrate to expose the insulating layer, the method should further include: forming a predetermined mask that covers a second side surface which is other than the first side surface among the side surfaces of the protrusion, the forming being performed between the forming of an uneven substrate and the forming of a first nitride semiconductor layer; partly removing the insulating layer to expose the first substrate; forming a third nitride semiconductor layer of the first conductive type on the exposed first substrate; forming a second light emitting layer on the third nitride semiconductor layer; and forming a fourth nitride semiconductor layer of the second conductive type on the second light emitting layer.

In this way, the nitride semiconductor layer is formed on the two substrates whose main surfaces have different plane directions, so that the nitride semiconductor layer grows planar and parallel to the main surface of the substrate. In this way, it is possible to easily form fine electrodes and recess-protrusion patterns using general semiconductor manufacturing processes. In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Furthermore, preferably the nitride semiconductor light emitting method according to the aspect of the present invention should further include: bonding a third substrate to the second nitride semiconductor layer and the fourth nitride semiconductor layer; and removing the first substrate, the insulating layer, and the second substrate.

In this case, it is possible to form, on the third substrate, the first nitride semiconductor layer having the uneven surface, and thus to manufacture the nitride semiconductor light emitting device having high light emission efficiency.

Furthermore, preferably in the nitride semiconductor light emitting method according to the aspect of the present invention, the forming of an uneven substrate should be forming the uneven structure having a side surface which is a (0001) plane, in an area on a sapphire substrate having a main surface which is a (11-20) plane, the method should further include: forming a third nitride semiconductor layer of the first conductive type on the main surface of the sapphire substrate; forming a second light emitting layer on the third nitride semiconductor layer; and forming a fourth nitride semiconductor layer of the second conductive type on the second light emitting layer.

In this way, the sapphire substrate is used to form the nitride semiconductor layers having different plane directions so that the nitride semiconductor layers grows planar and parallel to the main surface of the sapphire substrate.

Furthermore, preferably the nitride semiconductor light emitting method according to the aspect of the present invention should further include: bonding a third substrate to the second nitride semiconductor layer and the fourth nitride semiconductor layer; and removing the sapphire substrate.

In this case, it is possible to form, on the third substrate, the nitride semiconductor layer having the uneven surface, and thus to manufacture the nitride semiconductor light emitting device having high light emission efficiency.

Advantageous Effects

According to the present invention, it is possible to realize a nitride semiconductor light emitting device including the nitride semiconductor device with no or a reduced number of cracks.

In addition, according to a manufacturing method of the present invention, it is possible to manufacture a nitride semiconductor light emitting device including the nitride semiconductor device with no or a reduced number of cracks.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Hereinafter, nitride semiconductor light emitting devices and methods of manufacturing the same according to exemplary embodiments of the present invention are described with reference to the drawings.

Embodiment 1

Figure 1:
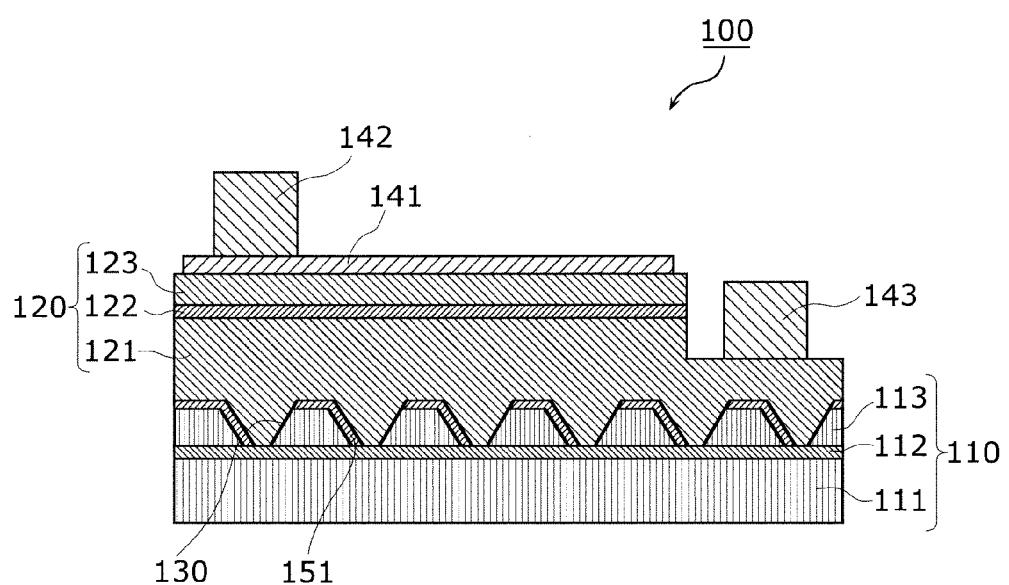
FIG. 1 is a cross-sectional view of a nitride semiconductor light emitting device according to Embodiment 1 of the present invention.

With reference to FIG. 1, a description is given of a nitride semiconductor light emitting device 100 according to Embodiment 1 of the present invention. FIG. 1 is a cross-sectional view of a nitride semiconductor light emitting device according to Embodiment 1 of the present invention.

As shown in FIG. 1, the nitride semiconductor light emitting device 100 includes a nitride semiconductor stack 120 formed on an uneven substrate 110. The nitride semiconductor stack 120 includes: an n-type nitride semiconductor layer 121 (a first nitride semiconductor layer) having the n-type as its first conductive type; a light emitting layer 122 (a first light emitting layer); and a p-type nitride semiconductor layer 123 (a second nitride semiconductor layer) having the p-type as its second conductive type. The uneven substrate 110 includes a first substrate 111 made of a silicon (Si) single crystal, an insulating layer 112, and a second substrate 113 made of a silicon (Si) single crystal stacked in this listed order.

In the uneven substrate 110, the first substrate 111 has a main surface (the plane direction of the main surface) which is a (100) silicon plane. In addition, the second substrate 113 includes a plurality of openings in which the surface of the insulating layer 112 is exposed to the nitride semiconductor stack 120. The second substrate 113 has an uneven structure including recesses which are the openings and protrusions formed between adjacent ones of the recesses. The recesses in the uneven structure have bottoms which are parts of the surface of the insulating layer 112. Accordingly, in this embodiment, the bottoms of the recesses are the parts of the insulating layer 112.

As shown in FIG. 1, among the side surfaces of each protrusion (recess) in the uneven structure of the second substrate 113, one side surface 130 is exposed and the other is covered by a second mask 151. The side surface 130 of the protrusion (recess) is different in plane direction from the main surface of the second substrate 113, and is a (111) silicon plane in this embodiment. In FIG. 1, the second mask 151 covers the main surface (top surface) of the second substrate 113, but does not always need to cover the main surface (top surface) of the second substrate 113.

In the nitride semiconductor stack 120, the n-type nitride semiconductor layer 121 is formed (i) to fill the openings (recesses) in the uneven structure in the second substrate 113, (ii) to be in contact with the insulating layer 112, and (iii) to be on the insulating layer 112 and the second substrate 113. Furthermore, in this embodiment, the n-type nitride semiconductor layer 121 has a thermal expansion coefficient smaller than that of the insulating layer 112. In other words, the thermal expansion coefficient of the insulating layer 112 is larger than that of the n-type nitride semiconductor layer 121. In addition, the n-type nitride semiconductor layer 121 has a planar top surface (the surface at the side of the light emitting layer 122).

The nitride semiconductor stack 120 includes: openings in which the n-type nitride semiconductor layer 121 is exposed; and an n-side electrode (an n-type electrode) 143 for electrical connection with the n-type nitride semiconductor layer 121. In addition, the p-type nitride semiconductor layer 123 includes: a transparent electrode 141; and a p-side electrode (a p-type electrode) 142 for electrical connection with the p-type nitride semiconductor layer 123.

In the above structure, the nitride semiconductor stack 120 includes: a p-type nitride semiconductor layer 123 which is for example made of gallium nitride (GaN) doped with magnesium (Mg); a light emitting layer 122 which is for example a multiple quantum well made of indium gallium nitride (InGaN) and GaN and adjusted to emit blue light having a center wavelength of 470 nm; and an n-type nitride semiconductor layer 121 which is for example made of GaN doped with silicon (Si). In addition, the p-type electrode 142 is a multilayer film made of metal such as titanium (Ti), aluminum (Al), nickel (Ni), and gold (Au). The n-type electrode 143 includes a multilayer film made of metal such as Ti, Al, Ni, and Au in contact with the n-type nitride semiconductor layer 121 partly exposed through selective removal of the p-type nitride semiconductor layer 123 and the light emitting layer 122. The transparent electrode 141 is made of a conductive material such as indium tin oxide (ITO) having a high transmissivity at a wavelength of approximately 470 nm.

Preferably, the insulating layer 112 should be a silicon oxide ($SiO_2$) film. The insulating layer 112 is not limited to a silicon oxide layer, and may be another layer made of a material or composition having a thermal expansion coefficient larger than that of the material or composition of the n-type nitride semiconductor layer 121.

In addition, preferably, the second mask 151 should be a multilayer film made of a dielectric material such as silicon oxide ($SiO_2$) or a dielectric composition such as $SiO_2$ and titanium oxide ($TiO_2$).

Next, a description is given of operations by the nitride semiconductor light emitting device 100 according to Embodiment 1 of the present invention.

As mentioned earlier, the nitride semiconductor light emitting device 100 according to this embodiment includes the insulating layer 112 having a thermal expansion coefficient larger than that of the n-type nitride semiconductor layer 121. Therefore, it is possible to reduce the possibility that cracks occur in the n-type nitride semiconductor layer 121.

In other words, cracks are more likely to occur, for example, in a GaN crystal grown on a silicon (Si) substrate. This is because a tensile stress occurs in the GaN crystal due to the difference between the thermal expansion coefficients of Si and GaN (the thermal expansion coefficient of Si is $2.6 \times 10^{-6}$/K, and the thermal expansion coefficient of GaN is $5.6 \times 10^{-6}$/K). The nitride semiconductor light emitting device 100 according to this embodiment includes, between the Si substrate and the GaN layer, a layer made of a material, such as $SiO_2$, (having a thermal expansion coefficient which is in a range of 8 to $10 \times 10^{-6}$/K) having a thermal expansion coefficient larger than that of the GaN layer. Thus, it is possible to reduce the tensile stress due to the difference between the thermal expansion coefficients of the Si substrate and the GaN layer. This reduction in the stress to be applied to the GaN layer reduces the possibility that cracks occur in the GaN layer.

The nitride semiconductor light emitting device 100 according to this embodiment has the uneven structure which is the second substrate 113. For this reason, it is possible to control the depth of the recesses in the uneven structure of the second substrate by controlling the thickness of the second substrate. Accordingly, it is possible to reduce the contact area between the second substrate 113 and the n-type nitride semiconductor layer 121 by controlling the thickness of the second substrate to have shallow recesses in the uneven structure. As a result, it is possible to reduce the stress to be applied to the n-type nitride semiconductor layer 121, and to thereby reduce the possibility that cracks occur in the n-type nitride semiconductor layer 121.

In the nitride semiconductor light emitting device 100 according to this embodiment, the uneven substrate 110 is a stack of layers which are the first substrate 111, the insulating layer 112, and the second substrate 113. Thus, the insulating layer 112 functions as an etching stop layer in alkaline wet etching using potassium hydroxide (KOH), tetramethylammonium hydroxide (TMAH), or the like for forming the uneven structure in the second substrate 113. As a result, it is possible to accurately form the uneven structure in the second substrate having high in-plane uniformity, and to thereby form, on the uneven structure, the nitride semiconductor stack 120 also having high in-plane uniformity. In particular, it is possible to form the n-type nitride semiconductor layer 121 having high in-plane uniformity on the uneven structure.

In addition, in the nitride semiconductor light emitting device 100 according to this embodiment, the second substrate 113 should preferably have a main surface which is one of (i) a plane which is oriented off by seven degrees from the (100) silicon plane, (ii) a (113) silicon plane, (iii) a (112) silicon plane, and (iv) the (110) silicon plane. In this case, the side surface 130 of the protrusion (recess) in the uneven structure in the second substrate 113 is designed to be a (111) silicon plane. Thus, it is possible to selectively and sequentially grow the crystalline layers of the nitride semiconductor stack 120 on the (111) silicon plane so that each of the main surfaces of the layers of the nitride semiconductor stack 120 have a non-polar surface which is tilted with respect to the c-plane made of gallium nitride. In particular, it is possible to form each of the main surfaces of the n-type nitride semiconductor layer 121 as one of (1-101), (11-22), (1-100), and (11-22) planes each made of gallium nitride. In this way, each of the main surfaces of the layers of the nitride semiconductor stack 120 is formed to be the non-polar surface tilted with respect to the c-plane made of gallium nitride. With this, it is possible to reduce the piezoelectric field in the light emitting layer 122. As a result, it is possible to accelerate special separation between electrons and holes in the light emitting layer 122, and to thereby increase the light emission efficiency.

In addition, in the nitride semiconductor light emitting device 100 according to this embodiment, the second substrate 113 has, as the uneven structure, a periodic structure in which recesses and protrusions are arranged at regular intervals. With this, it is possible to increase the light extraction efficiency of extracting light from the light emitting layer 122 to outside of the nitride semiconductor stack 120.

According to this embodiment, it is possible to reduce the possibility that cracks occur, and to thereby manufacture nitride semiconductor light emitting devices having high in-plane uniformity in each layer and achieving high light emission efficiency.

Figure 2:
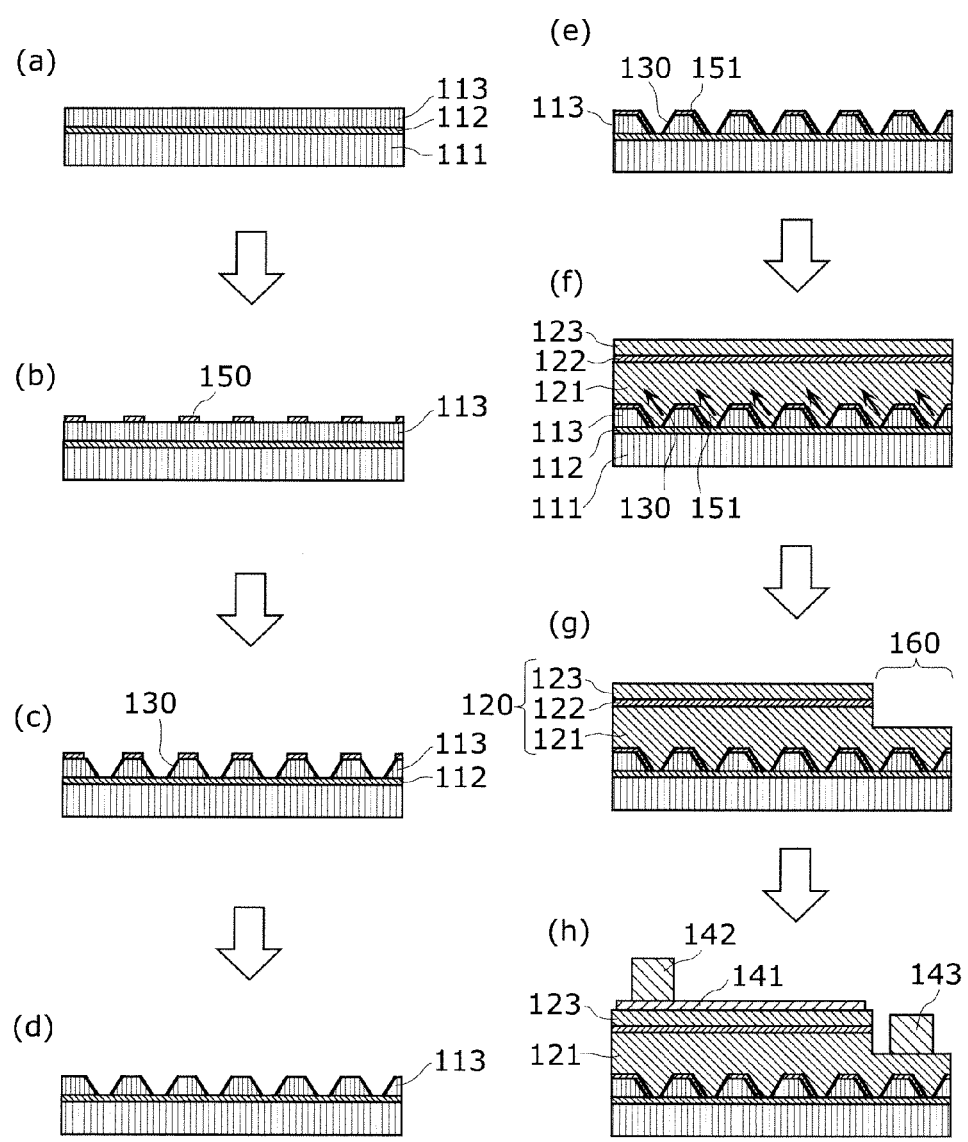
FIG. 2 shows schematic cross-sectional views of a nitride semiconductor light emitting device according to Embodiment 1 of the present invention in processes of a manufacturing method according to the present invention.

With reference to FIG. 2, a description is given of a method of manufacturing the nitride semiconductor light emitting device 100 according to Embodiment 1 of the present invention. FIG. 2 shows schematic cross-sectional views of the nitride semiconductor light emitting device according to Embodiment 1 of the present invention in processes of a manufacturing method according to the present invention.

As shown in (a) of FIG. 2, a first substrate 111 made of a silicon (Si) single crystal and a second substrate 113 made of a silicon (Si) single crystal are bonded through an insulating layer 112 made of $SiO_2$ or the like. At this time, the second substrate 113 has a main surface different in plane direction from a (111) silicon plane.

Next, a first mask 150 which is one of a silicon oxide film and a silicon nitride film is formed on the second substrate 113 using a thermal oxidation method or a plasma enhanced Chemical Vapor Deposition (CVD) method. Next, as shown in (b) of FIG. 2, patterning is performed on the first mask 150 using a photolithography method and a dry etching method to form stripe-shaped openings which extend in the perpendicular direction in FIG. 2 and in which the second substrate 113 is exposed.

Next, as shown in (c) of FIG. 2, wet etching using potassium hydroxide (KOH), tetramethylammonium hydroxide (TMAH), or the like is performed on the second substrate 113 to form openings (which are recesses) which penetrate the second substrate 113. These recesses form island-shaped protrusions in the uneven structure. In this way, the insulating layer 112 is exposed in the openings penetrating the second substrate 113. At this time, the side surface 130 of each protrusion (recess) in the uneven structure of the second substrate 113 is a tilted surface which is a (111) silicon plane.

Next, as shown in (d) of FIG. 2, the first mask 150 is removed by wet etching using hydrofluoric acid (HF) or the like.

Next, as shown in (e) of FIG. 2, among the side surfaces of each protrusion (recess) in the uneven structure formed on the second substrate 113, the side surface 130 is kept exposed, and the other side surface is covered by the second mask 151 using a sputtering method or a vacuum deposition method. At this time, the main surface (top surface) of the second substrate 113 is also covered by the second mask 151. The main surface (top surface) of the second substrate 113 is covered by the second mask 151 in this embodiment, but does not always need to be covered by the second mask 151.

Next, as shown in (f) of FIG. 2, using a Metal Organic Chemical Vapor Deposition (MOCVD) method, the n-type nitride semiconductor layer 121 is formed to fill the openings (recesses) that are on the insulating layer 112 and between the protrusions in the second substrate 113, and then the light emitting layer 122 and the p-type nitride semiconductor layer 123 are formed on the n-type nitride semiconductor layer 121.

At this time, the crystal growth of the n-type nitride semiconductor layer 121 is started along the exposed parts of the second substrate 113, more specifically, the plane direction (the diagonal arrow direction in the (f) of FIG. 2) of the side surface 130 of each protrusion (recess) in the uneven structure of the second substrate 113. In the crystal growth process of the n-type nitride semiconductor layer 121, n-type nitride semiconductor layers are grown in adjacent openings, specifically on the unmasked side surfaces 130 of the openings and also on the second masks 151 in the openings, to cover the openings and to finally be integrated into the n-type nitride semiconductor layer 121. In this way, the n-type nitride semiconductor layer 121 is formed to have a planar top surface parallel to the main surface of the second substrate 111. In addition, the crystalline light emitting layer 122 and the p-type nitride semiconductor layer 123 are also grown to have planar surfaces parallel to the main surface of the second substrate 111.

Next, as shown in (g) of FIG. 2, an opening part 160 is formed in the nitride semiconductor stack 120 using a photolithography method and a dry etching method to expose the n-type nitride semiconductor layer 121.

Next, as shown in (h) of FIG. 2, a transparent electrode 141 and a p-type electrode 142 are formed to be electrically connected to the p-type nitride semiconductor layer 123 using a photolithography method and a vacuum deposition method. In addition, an n-type electrode 143 is formed to be electrically connected to the n-type nitride semiconductor layer 121.

Lastly, nitride semiconductor light emitting devices are formed by performing chip separation by blade dicing (not shown).

In this way, it is possible to reduce the possibility that cracks occur, and manufacture nitride semiconductor light emitting devices having high light emission efficiency.

Embodiment 2

Figure 3:
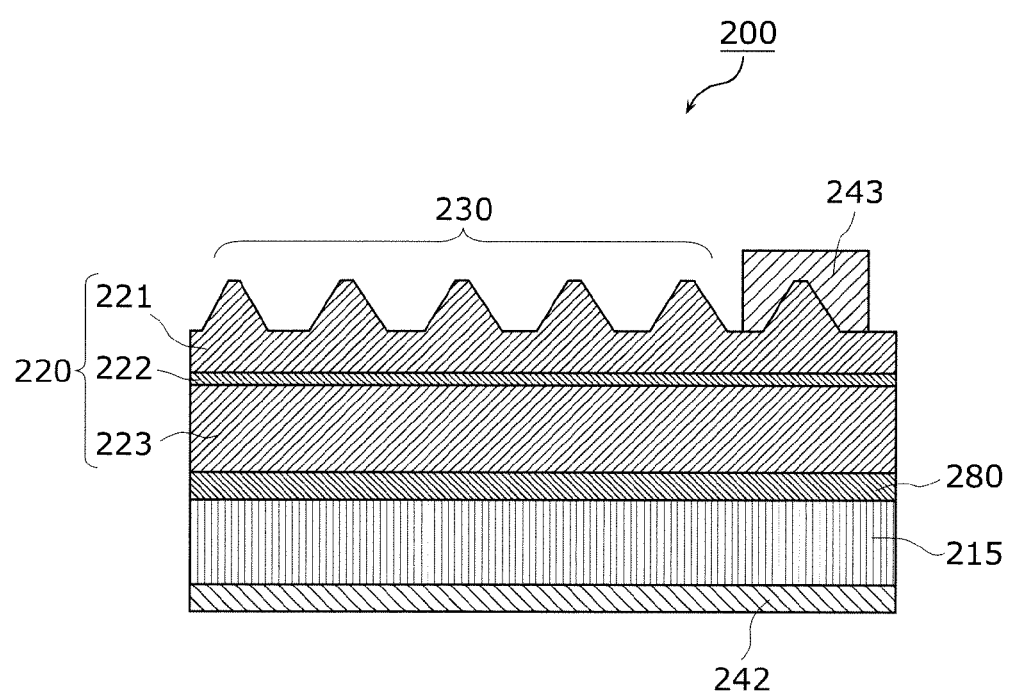
FIG. 3 is a cross-sectional view of a nitride semiconductor light emitting device according to Embodiment 2 of the present invention.

With reference to FIG. 3, a description is given of a nitride semiconductor light emitting device 200 according to Embodiment 2 of the present invention. FIG. 3 is a cross-sectional view of the nitride semiconductor light emitting device 200 according to Embodiment 2 of the present invention.

As shown in FIG. 3, the nitride semiconductor light emitting device 200 according to Embodiment 2 has a stack in which a nitride semiconductor stack 220 is formed on a reflection layer 280 stacked on a third substrate 215. The nitride semiconductor stack 220 includes: a p-type nitride semiconductor layer 223 (a second nitride semiconductor layer); a light emitting layer 222 (a first light emitting layer); and an n-type nitride semiconductor layer 221 (a first nitride semiconductor layer). The third substrate 215 and the reflection layer 280 are conductive.

In the nitride semiconductor stack 220, the n-type nitride semiconductor layer 221 has an uneven structure with an uneven surface 230.

On the nitride semiconductor layer 221, an n-type electrode 243 is formed to be electrically connected to the n-type nitride semiconductor layer 221. In addition, the third substrate 215 has a surface on which the reflection layer 280 is formed and an opposite surface on which a p-type electrode 242 is formed.

In the above structure, the nitride semiconductor stack 220 includes: a p-type nitride semiconductor layer 223 which is for example made of gallium nitride (GaN) doped with magnesium (Mg); a light emitting layer 222 which is for example a multiple quantum well made of indium gallium nitride (InGaN) and GaN and adjusted to emit blue light having a center wavelength of 470 nm; and an n-type nitride semiconductor layer 221 which is for example made of GaN doped with silicon (Si). The reflection layer 280 is made of metal, such as silver (Ag) and aluminum (Al), having a high reflection rate of light having a wavelength of approximately 470 nm. The p-type electrode 242 is a multilayer film made of metal such as titanium (Ti), Al, nickel (Ni), and gold (Au). The n-type electrode 243 is a multilayer film made of metal such as Ti, Al, Ni, and Au.

In addition, the uneven surface 230 formed in the n-type nitride semiconductor layer 221 should preferably have a periodic structure in which same-shape recesses and same-shape protrusions are arranged at regular intervals.

Figure 4:
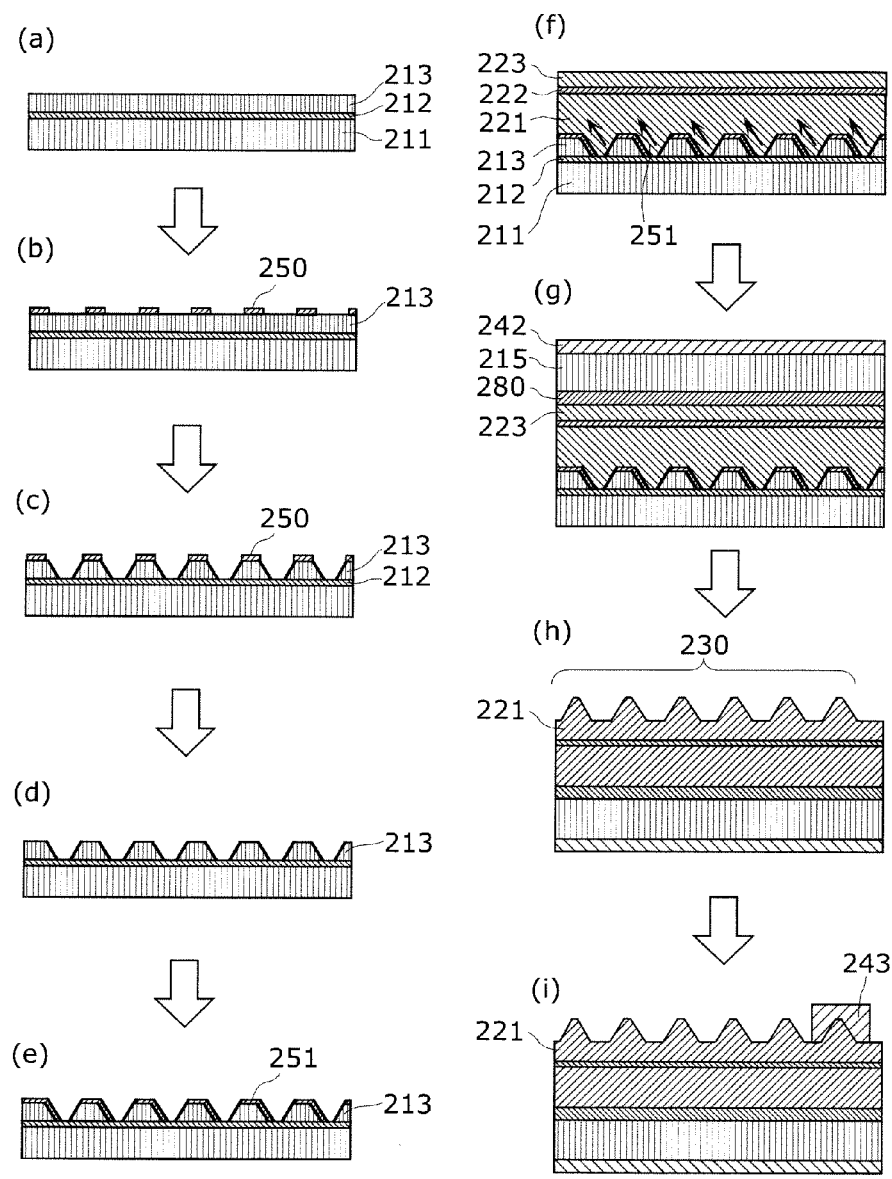
FIG. 4 shows schematic cross-sectional views of the nitride semiconductor light emitting device according to Embodiment 2 of the present invention in processes of a manufacturing method according to the present invention.

With reference to FIG. 4, a description is given of a method of manufacturing the nitride semiconductor light emitting device 200 according to Embodiment 2 of the present invention. FIG. 4 shows schematic cross-sectional views of the nitride semiconductor light emitting device according to Embodiment 2 of the present invention in processes of a manufacturing method according to the present invention.

As shown in (a) of FIG. 4, a first substrate 211 made of a silicon (Si) single crystal and a second substrate 213 made of a silicon (Si) single crystal are bonded through an insulating layer 212. At this time, the second substrate 213 has a main surface different in plane direction from a (111) silicon plane. At this time, the insulating layer 212 is made of a material having a high thermal expansion coefficient higher than that of the n-type semiconductor layer 221 which is stacked later. As in Embodiment 1, silicon oxide ($SiO_2$) having a thermal expansion coefficient of 8 to $10 \times 10^{-6}$/K is used in this embodiment.

Next, a first mask 250 which is one of a silicon oxide film and a silicon nitride film is formed on the second substrate 213 using a thermal oxidation method or a plasma enhanced Chemical Vapor Deposition (CVD) method. Next, as shown in (b) of FIG. 4, patterning is performed on the first mask 250 using a photolithography method and a dry etching method to form stripe-shaped openings which extend in the perpendicular direction in FIG. 4 and in which the second substrate 213 is exposed.

Next, as shown in (c) of FIG. 4, wet etching using potassium hydroxide (KOH), tetramethylammonium hydroxide (TMAH), or the like is performed on the second substrate 213 to form openings (which are recesses) which penetrate the second substrate 213. These recesses form island-shaped protrusions in the uneven structure. In this way, the insulating layer 212 is exposed in the openings in the second substrate 213. At this time, a first side surface of each protrusion (recess) in the uneven structure of the second substrate 213 is a tilted surface which is a (111) silicon plane.

Next, as shown in (d) of FIG. 4, the first mask 250 is removed by wet etching using hydrofluoric acid (HF) or the like.

Next, as shown in (e) of FIG. 4, among the side surfaces of each protrusion (recess) in the uneven structure formed in the second substrate 213, a second side surface is covered by the second mask 251 using a sputtering method or a vacuum deposition method. At this time, the main surface (top surface) of the second substrate 213 is also covered by the second mask 251.

Next, as shown in (f) of FIG. 4, using a Metal Organic Chemical Vapor Deposition (MOCVD) method, the n-type nitride semiconductor layer 221 is formed to fill the openings (recesses) that are on the insulating layer 212 and between the protrusions in the second substrate 213, and then the light emitting layer 222 and the p-type nitride semiconductor layer 223 are formed on the n-type nitride semiconductor layer 221.

At this time, the crystal growth of the n-type nitride semiconductor layer 221 is started along the exposed parts of the second substrate 213, more specifically, the plane direction of the first side surface of each protrusion (recess) in the uneven structure of the second substrate 213. In the crystal growth process of the n-type nitride semiconductor layer 221, n-type nitride semiconductor layers are grown in adjacent openings, specifically on the unmasked side surfaces of the openings and also on the second masks 251 in the openings to cover the openings and to finally be integrated into the n-type nitride semiconductor layer 221. In this way, the n-type nitride semiconductor layer 221 is formed to have a planar top surface parallel to the main surface of the first substrate 211. In addition, the crystalline light emitting layer 222 and p-type nitride semiconductor layer 223 are also grown to have planar surfaces parallel to the main surface of the first substrate 211.

Next, as shown in (g) of FIG. 4, a third substrate 215 is bonded to the p-type nitride semiconductor layer 223 via the reflection layer 280. Next, a p-type electrode 242 is formed on the third substrate 215 using a vacuum deposition method.

Next, the nitride semiconductor stack shown in (g) of FIG. 4 is turned upside down, and, as shown in (h) of FIG. 4, the first substrate 211, the insulating layer 212, and the second substrate 213 are removed by etching such as dry etching using a chlorine trifluoride ($ClF_3$) gas and wet etching using nitric-hydrofluoric acid. In this way, it is possible to form the n-type nitride semiconductor layer 221 having a top surface which is the uneven surface 230.

Next, as shown in (i) of FIG. 4, an n-type electrode 243 is formed to be electrically connected to the n-type nitride semiconductor layer 221 using a photolithography method and a vacuum deposition method.

Lastly, nitride semiconductor light emitting devices are formed by performing chip separation by blade dicing (not shown).

In this way, it is possible to manufacture the nitride semiconductor light emitting device 200 according to Embodiment 2 of the present invention.

In this way, the nitride semiconductor light emitting device 200 according to Embodiment 2 includes the first substrate 211, the insulating layer 212 having a thermal expansion coefficient larger than that of the n-type nitride semiconductor layer 221, and the crystalline n-type nitride semiconductor 221 grown on the insulating layer 212. In this way, as in Embodiment 1, it is possible to reduce, in the n-type nitride semiconductor layer 221, tensile stress due to the difference in the thermal expansion coefficients between the first substrate 211 and the n-type nitride semiconductor layer 221. Accordingly, it is possible to reduce the stress to be applied to the n-type nitride semiconductor layer 221, and to thereby reduce the possibility that cracks occur in the n-type nitride semiconductor layer 221.

Furthermore, the nitride semiconductor light emitting device 200 according to Embodiment 2 includes the n-type nitride semiconductor layer 221 including the uneven surface 230 in the uneven structure of the second substrate 213. For this reason, it is possible to form recesses having a desired depth (or protrusions having a desired height) in the uneven structure in the second substrate 213 by suitably designing the height of the protrusions (or the depth of the recesses) in the uneven surface 230 of the n-type nitride semiconductor layer 221. In other words, it is possible to form the protrusions having a desired height (or recesses having a desired depth) in the uneven surface 230 of the n-type nitride semiconductor layer 221 by suitably designing the thickness of the second substrate 213. Accordingly, it is possible to reduce the contact area between the second substrate 213 and the n-type nitride semiconductor layer 221 by designing a thin second substrate 213 for forming shallow recesses in the uneven structure. As a result, it is possible to reduce the stress to be applied to the n-type nitride semiconductor layer 221, and to thereby reduce the possibility that cracks occur in the n-type nitride semiconductor layer 221.

In addition, when the uneven surface 230 on the n-type nitride semiconductor layer 221 is formed in the nitride semiconductor light emitting device 200 according to this embodiment, a stack of the first substrate 211, the insulating layer 212, and the second substrate 213 is used. Thus, the insulating layer 212 functions as an etching stop layer in alkaline wet etching using potassium hydroxide (KOH), tetramethylammonium hydroxide (TMAH), or the like for forming the uneven structure in the second substrate 213. As a result, it is possible to accurately form the uneven structure in the second substrate 213 having high in-plane uniformity, and to thereby form, on the uneven structure, the uneven surface 230 of the n-type nitride semiconductor layer 221, the light emitting layer 222, and the p-type nitride semiconductor layer 223 each also having high in-plane uniformity.

In addition, in the nitride semiconductor light emitting device 200 in this embodiment, the second substrate 213 should preferably have a main surface which is one of (i) a plane which is oriented off by seven degrees from a (100) silicon plane, (ii) a (113) silicon plane, (iii) a (112) silicon plane, and (iv) a (110) silicon plane. In this case, the side surface of the protrusion (recess) in the uneven structure in the second substrate 213 is designed to be a (111) silicon plane. Thus, it is possible to selectively and sequentially grow the crystalline layers of the nitride semiconductor stack 220 on the (111) silicon plane so that each of the main surfaces of the layers of the nitride semiconductor stack 220 have a non-polar surface which is tilted with respect to the c-plane made of gallium nitride. In particular, it is possible to form each of the main surfaces of the n-type nitride semiconductor layer 221 as one of (1-101), (11-22), (1-100), and (11-22) planes each made of gallium nitride. In this way, each of the main surfaces of the layers of the nitride semiconductor stack 220 are formed to be the non-polar surface tilted with respect to the c-plane made of gallium nitride. With this, it is possible to reduce the piezoelectric field in the light emitting layer 222. As a result, it is possible to accelerate special separation between electrons and holes in the light emitting layer 222, and to thereby increase the light emission efficiency.

In addition, in the nitride semiconductor light emitting device 200 according to this embodiment, the n-type nitride semiconductor layer 221 has, as the uneven surface 230, a periodic structure in which recesses and protrusions are arranged at regular intervals. Thus, it is possible to increase the light extraction efficiency of extracting light from the light emitting layer 222 to outside of the nitride semiconductor stack 220. Here, it is possible to form the uneven surface 230 having the periodic structure in which recesses and protrusions are arranged at regular intervals by forming the second substrate 213 having the uneven structure in which recesses and protrusions are arranged at regular intervals.

In this way, also in this embodiment, it is possible to reduce the possibility that cracks occur, and manufacture nitride semiconductor light emitting devices having high in-plane uniformity and high light emission efficiency.

Embodiment 3

Figure 5A:
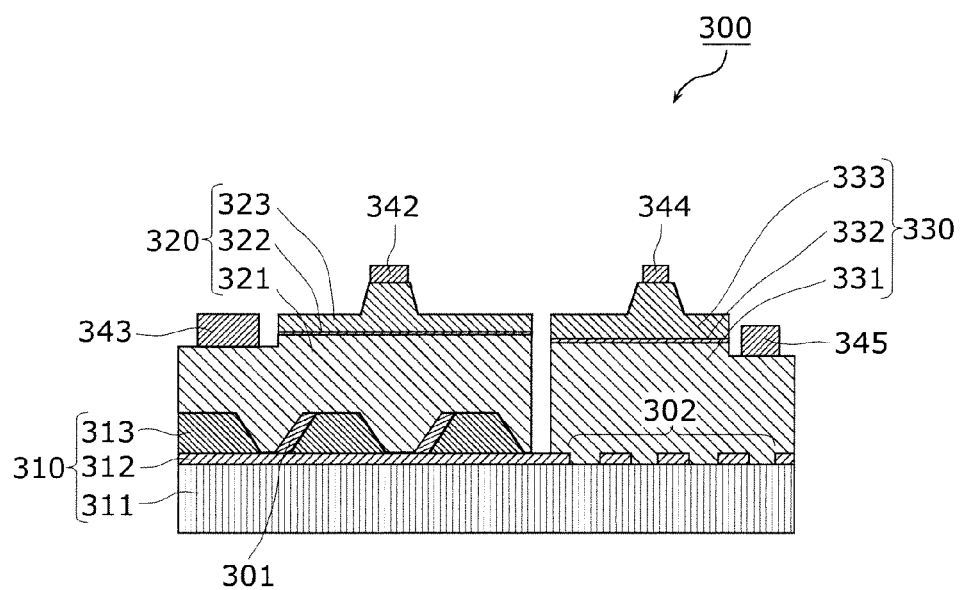
FIG. 5A is a cross-sectional view of a nitride semiconductor light emitting device according to Embodiment 3 of the present invention.
Figure 5B:
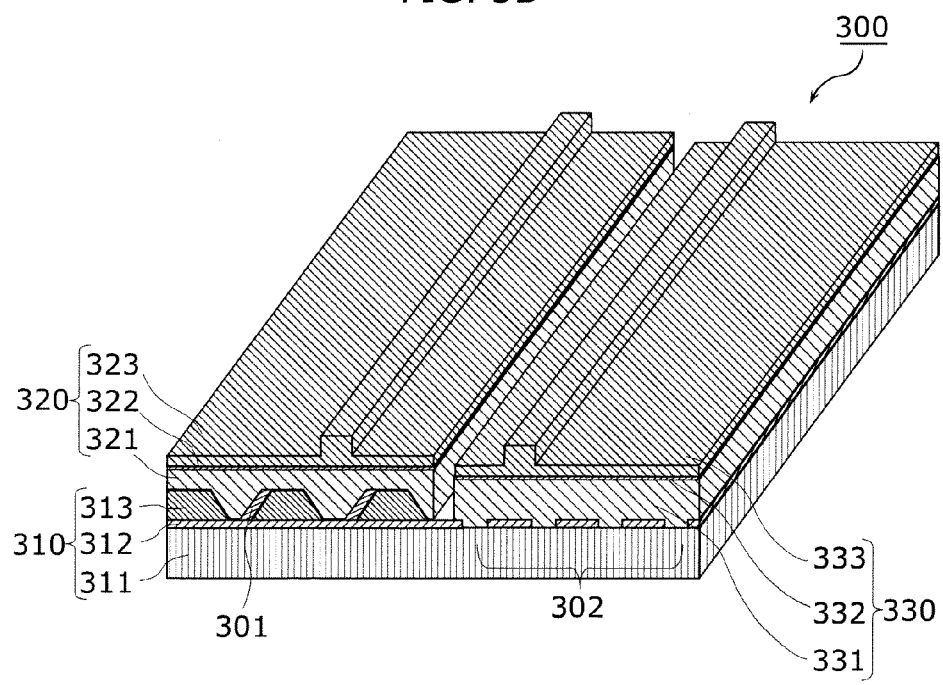
FIG. 5B is a cross-sectional view of the nitride semiconductor light emitting device according to Embodiment 3 of the present invention.

With reference to FIGS. 5A and 5B, a description is given of a nitride semiconductor light emitting device 300 according to Embodiment 3 of the present invention. FIG. 5A is a cross-sectional view of the nitride semiconductor light emitting device 300 according to Embodiment 3. FIG. 5B is a cross-sectional view of the nitride semiconductor light emitting device 300 according to Embodiment 3. FIG. 5B shows the nitride semiconductor light emitting device 300 which is in a process and thus is not provided with a first n-type electrode 343, a first p-type electrode 342, a second n-type electrode 345, and a second p-type electrode 344 as shown in FIG. 5A.

As shown in FIGS. 5A and 5B, the nitride semiconductor light emitting device 300 according to Embodiment 3 includes an uneven substrate 310 which includes a first substrate 311 made of a silicon (Si) single crystal, an insulating layer 312, and a second substrate 313 made of a silicon (Si) single crystal stacked in this listed order.

Here, the uneven substrate 310 includes a first area in which the second substrate 313 is formed as a set of island-shaped protrusions in an uneven structure and in which the insulating layer 312 is partly exposed below recesses formed between the protrusions and a second area in which no second substrate 313 is formed and the first substrate 311 is partly exposed below openings formed in the insulating layer 312.

In the first area, among the side surfaces of each protrusion in the uneven structure of the second substrate 313, a first side surface is a (111) silicon plane exposed, and a second side surface is covered with a second mask 301. The recesses in the uneven structure have bottoms which are parts of the surface of the insulating layer 312. Accordingly, in this embodiment, the bottoms of the recesses are the parts of the insulating layer 312.

On the second substrate 313 in the first area, a first nitride semiconductor stack 320 is formed which is a stack in which the following layers are stacked in the listed order: a first n-type semiconductor layer 321 (a first nitride semiconductor layer); a first light emitting layer 322; and a first p-type semiconductor layer 323 (a second nitride semiconductor layer). The first n-type semiconductor layer 321 fills the recesses in the uneven structure in the first area and finally grows planar and parallel to the main surface of the first substrate 311.

The first nitride semiconductor stack 320 includes an opening in which the first n-type semiconductor layer 321 is exposed. A first n-side electrode (first n-type electrode) 343 and a first p-side electrode (first p-type electrode) 342 are formed on the first n-type semiconductor layer 321 and the first p-type semiconductor layer 323, respectively, to be electrically connected to each other.

Furthermore, a ridge is formed on the first p-type semiconductor layer 323, and thus a high electric current applied between the first n-type electrode 343 and the first p-type electrode 342 causes the first light emitting layer 322 to emit laser light having a desired wavelength.

On the other hand, in the second area of the uneven substrate 310, an opening part 302 is formed in the insulating layer 312. On the opening part 302 in the second area, a second nitride semiconductor stack 330 is formed which is a stack of the following layers stacked in the listed order: a second n-type semiconductor layer 331 (a third nitride semiconductor layer); a second light emitting layer 332; and a second p-type semiconductor layer 333 (a fourth nitride semiconductor layer).

The second nitride semiconductor stack 330 includes an opening in which the first n-type semiconductor layer 331 is exposed. A second n-side electrode (second n-type electrode) 345 and a second p-side electrode (second p-type electrode) 344 are formed on the second n-type semiconductor layer 331 and the second p-type semiconductor layer 333, respectively, to be electrically connected to each other.

Furthermore, a ridge is formed on the second p-type semiconductor layer 333, and thus a high electric current applied between the second n-type electrode 345 and the second p-type electrode 344 causes the second light emitting layer 332 to emit laser light having a desired wavelength.

The first nitride semiconductor stack 320 and the second nitride semiconductor stack 330 are respectively formed on the first area and the second area of the uneven substrate 310, but are insulated by the insulating layer 312 positioned below the first nitride semiconductor stack 320. The first nitride semiconductor stack 320 and the second nitride semiconductor stack 330 are separate devices, and thus each of which emits light having a different center wavelength.

In this device structure, the first nitride semiconductor stack 320 includes: a first p-type semiconductor layer 323 which is for example made of gallium nitride (GaN) doped with magnesium (Mg); a first light emitting layer 322 which is for example a multiple quantum well made of indium gallium nitride (InGaN) and GaN and adjusted to emit blue light having a center wavelength of 470 nm; and a first n-type semiconductor layer 321 which is for example made of GaN doped with silicon (Si). In addition, the first p-type electrode 342 includes a multilayer film made of metal such as titanium (Ti), aluminum (Al), nickel (Ni), and gold (Au). The first n-type electrode 343 includes a multilayer film made of metal such as Ti, Al, Ni, and Au in contact with the first n-type semiconductor layer 321 partly exposed through selective removal of the first p-type semiconductor layer 323 and the first light emitting layer 322.

In this device structure, the second nitride semiconductor stack 330 includes: a second p-type semiconductor layer 333 which is for example made of gallium nitride (GaN) doped with magnesium (Mg); a second light emitting layer 332 which is for example a multiple quantum well made of indium gallium nitride (InGaN) and GaN and adjusted to emit green light having a center wavelength of 530 nm; and a second n-type semiconductor layer 331 which is for example made of GaN doped with silicon (Si). The second p-type electrode 344 is a multilayer film made of metal such as Ti, Al, Ni, and Au. The second n-type electrode 345 is made of a multilayer film made of metal such as Ti, Al, Ni, and Au in contact with the second n-type semiconductor layer 331 partly exposed through selective removal of the second p-type semiconductor layer 333 and the second light emitting layer 332.

Preferably, the insulating layer 312 should be a silicon oxide (SiO$_2$) film. In addition, the second substrate 313 should preferably have a main surface which is one of (i) a plane which is oriented off by seven degrees from the (100) silicon plane, (ii) a (113) silicon plane, (iii) a (112) silicon plane, and (iv) a (110) silicon plane. In addition, the second substrate 313 should preferably have, as the uneven structure formed in the second substrate 313, a periodic structure in which recesses and protrusions are arranged at regular intervals. The opening part 302 should preferably have a periodic structure in which the openings and parts of the insulating layer 312 appear at regular intervals.

The second mask 301 should preferably be a multilayer film made of a dielectric material such as silicon oxide (SiO$_2$) or a dielectric composition such as SiO$_2$ and titanium oxide (TiO$_2$).

Next, a description is given of operations by the nitride semiconductor light emitting device 300 according to Embodiment 3.

In the nitride semiconductor light emitting device 300 according to Embodiment 3, GaN crystals are grown on an Si substrate that has surfaces (such as a (111) silicon plane and a seven-degree off-oriented (100) silicon plane) having different plane directions, and thus the GaN crystal surfaces are different depending on the plane directions. For example, a (0001) GaN plane grows on the (111) silicon plane, and a (1-101) GaN plane grows on the seven-degree off-oriented (100) silicon plane. Accordingly, it is possible to enable the GaN crystals having different plane directions to grow, at narrow intervals, planar and parallel to the main surfaces of the substrates. It is possible to easily create, on the planar surface, a fine electrode pattern for increasing current application or a fine recess-protrusion pattern for increasing light extraction efficiency using general semiconductor manufacturing processes such as photolithography and dry etching. In this way, it is possible to increase the light emission efficiency of the nitride semiconductor light emitting device. As a result, it is possible to realize a nitride semiconductor light emitting device which provides high light emission efficiency and has a narrow light emission point interval.

For example, in the light emitting layers made of InGaN or the like on the different crystal surfaces have a different indium (In) incorporation efficiency. Under the same growth condition, the InGaN light emitting layer on a (1-101) GaN plane has an indium (In) incorporation efficiency lower than the indium (In) incorporation efficiency of the InGaN light emitting layer on a (0001) GaN plane. For this reason, the InGaN light emitting layer on the (1-101) GaN plane emits light having a wavelength lower than the wavelength of light which is emitted from the InGaN light emitting layer on the (0001) GaN plane. As a result, one-time crystal growth makes it possible to manufacture a nitride semiconductor light emitting device having different light wavelength peaks.

The first nitride semiconductor stack 320 and the second nitride semiconductor stack 330 are not electrically connected to each other, and thus it is possible to independently form a first set of the first n-type electrode 343 and the first p-type electrode 342 and a second set of the second n-type electrode 345 and the second p-type electrode 344. For this reason, it is possible to manufacture a nitride semiconductor light emitting device capable of independently driving the first nitride semiconductor stack 320 which emits light having a wavelength and the second nitride semiconductor stack 330 which emits light having a different wavelength.

The main surface of the second substrate 313 is designed to be one of the seven-degree off-oriented (100) silicon plane, the (113) silicon plane, the (112) silicon plane, and the (110) silicon plane. The crystalline first nitride semiconductor stack 320 is selectively grown on the main surface and the (111) silicon plane formed on the side surface of the protrusion of the second substrate 313. In this way, it is possible to design the first nitride semiconductor stack 320 having a main surface which is non-polar and tilted with respect to the (0001) GaN plane. For this reason, it is possible to reduce the piezoelectric field in the first light emitting layer 322. As a result, it is possible to accelerate special separation between electrons and holes in the first light emitting layer 322, and to thereby increase the light emission efficiency.

In addition, since the second substrate 313 is formed to have, as the uneven structure, the periodic structure in which recesses and protrusions are arranged at regular intervals, it is possible to efficiently extract light emitted from the first light emitting layer 322 to outside of the first nitride semiconductor stack 320.

In addition, in this embodiment, due to the difference in the plane directions in which crystals are grown, the second nitride semiconductor stack 330 generally grows faster in the direction perpendicular to the substrate than the first nitride semiconductor stack 320 having the uneven structure. For this reason, in the early stage of the crystal growth, the first nitride semiconductor stack 320 is thicker than the second nitride semiconductor stack 330 by the thickness of the uneven structure. With the advancement of the crystal growth on the planar surface, the level difference between these two crystal surfaces is reduced due to the difference in the crystal growth speeds. Accordingly, it is possible to form a finer pattern, and to thereby realize a nitride semiconductor light emitting device that provides high light emission efficiency.

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Similarly to the nitride semiconductor light emitting device 100 according to Embodiment 1, the nitride semiconductor light emitting device 300 according to this embodiment includes an insulating layer 312 designed to have a thermal expansion coefficient larger than the thermal expansion coefficients of the first n-type semiconductor layer 321 and the second n-type semiconductor layer 331. Thus, it is possible to reduce the possibility that cracks occur in the first n-type semiconductor layer 321 and the second n-type semiconductor layer 331.

Figure 6:
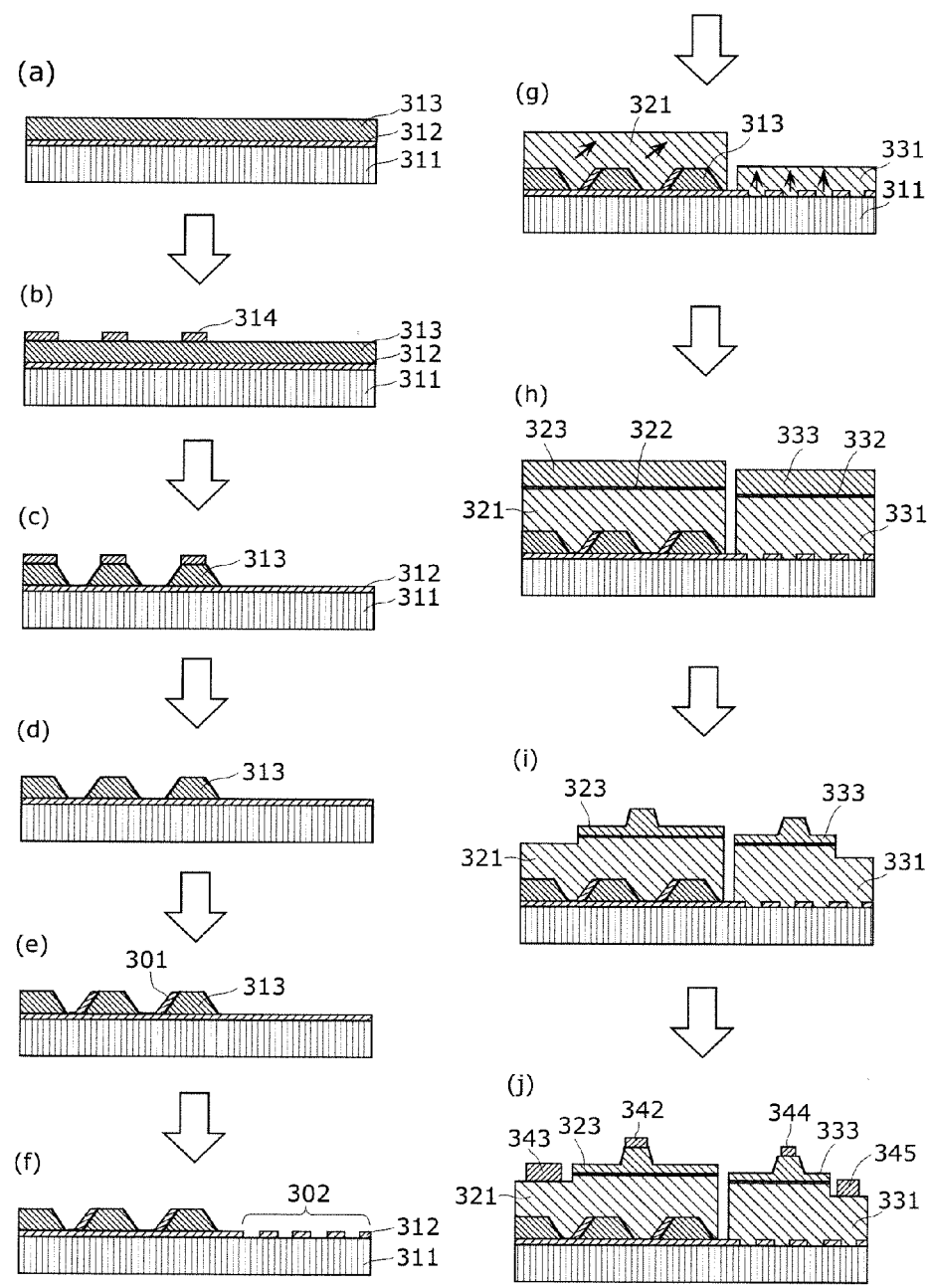
FIG. 6 shows schematic cross-sectional views of the nitride semiconductor light emitting device according to Embodiment 3 of the present invention in processes of a manufacturing method according to the present invention.

With reference to FIG. 6, a description is given of a method of manufacturing the nitride semiconductor light emitting device 300 according to Embodiment 3 of the present invention. FIG. 6 shows schematic cross-sectional views of the nitride semiconductor light emitting device according to Embodiment 3 of the present invention in processes of a manufacturing method according to the present invention.

As shown in (a) of FIG. 6, a first substrate 311 made of a silicon (Si) single crystal and a second substrate 313 made of a silicon (Si) single crystal are bonded through an insulating layer 312 made of SiO$_2$ or the like. At this time, the second substrate 313 has a main surface different in plane direction from a (111) silicon plane.

Next, a first mask 314 which is one of a silicon oxide film and a silicon nitride film is formed on the second substrate 313 using a thermal oxidation method or a plasma enhanced Chemical Vapor Deposition (CVD) method. Next, as shown in (b) of FIG. 6, patterning is performed on the first mask 314 using a photolithography method and a dry etching method to form stripe-shaped openings which extend in the perpendicular direction in FIG. 6 and in which the second substrate 313 is exposed. In the part to be the second area, the first mask 314 is completely removed by etching.

Next, as shown in (c) of FIG. 6, wet etching using potassium hydroxide (KOH), tetramethylammonium hydroxide (TMAH), or the like is performed on the second substrate 313 to form openings in the second substrate 313. These recesses form island-shaped protrusions in the uneven structure. In this way, the insulating layer 312 is exposed in the openings of the second substrate 313. At this time, one side surface of each protrusion of the second substrate 313 is a tilted surface which is a (111) silicon plane. The second substrate 313 is completely removed from the part to be the second area.

Next, as shown in (d) of FIG. 6, the first mask 314 is removed by wet etching using hydrofluoric acid (HF) or the like. In this way, it is possible to form an uneven structure in the first area.

Next, as shown in (e) of FIG. 6, among the side surfaces of each protrusion in the uneven structure formed on the second substrate 313, the other side surface is covered by the second mask 301 using a sputtering method or a vacuum deposition method.

Next, as shown in (f) of FIG. 6, openings are formed in the insulating layer 312 by selectively removing the insulating layer 312 from the second area in which no uneven structure is left after the removal of the second substrate 313, using a photolithography method or a dry etching method. In this way, the opening part 302 is formed on the insulating layer 312, and the first substrate 311 is exposed in each of the openings. Preferably, the openings in the opening part 302 should be formed at regular intervals.

Next, as shown in (g) of FIG. 6, the first n-type semiconductor layer 321 and the second n-type semiconductor layer 331 are formed, using the MOCVD method, on the first area having the uneven structure of the second substrate 313 and the second area having the opening part 302, respectively. At this time, in the first area, the crystal growth of the n-type semiconductor layer 321 is started along the exposed parts of the second substrate 313, more specifically, the main surface of the second substrate 313 and the plane direction (the diagonal arrow direction in the (g) of FIG. 6) of the side surface of each protrusion. Finally, the first n-type semiconductor layer 321 grows planar and parallel to the main surface of the first substrate 311. In addition, in the second area, the crystal growth of the second n-type semiconductor layer 331 is started along the exposed main surface of the first substrate 311 (the upward arrow direction in the (g) of FIG. 6). Finally, the second n-type semiconductor layer 331 grows planar and parallel to the main surface of the first substrate 311. In this way, the second n-type semiconductor layer 331 grows faster in the direction perpendicular to the main surface of the second substrate 313 than the first n-type semiconductor layer 321. Accordingly, as the crystal growth of the two semiconductor layers advances, the level difference between the two crystal surfaces is reduced.

As shown in (h) of FIG. 6, using the MOCVD method, the first light emitting layer 322 and the first p-type semiconductor layer 323 are formed on the first n-type semiconductor layer 321, and the second light emitting layer 332 and the second p-type semiconductor layer 333 are formed on the second n-type semiconductor layer 331.

Next, as shown in (i) of FIG. 6, a ridge is formed on the first p-type semiconductor layer 323 and the second p-type semiconductor layer 333 using a photolithography method and a dry etching method. Likewise, openings are selectively formed in the first n-type semiconductor layer 321 and the second n-type semiconductor layer 331 to expose the first n-type semiconductor layer 321 and the second n-type semiconductor layer 331.

As shown in (j) of FIG. 6, a first n-type electrode 343 is formed to be electrically connected to the first n-type semiconductor layer 321 and a first p-type electrode 342 is formed to be electrically connected to the first p-type semiconductor layer 323, using a photolithography method and a vacuum deposition method. Likewise, a second n-type electrode 345 is formed to be electrically connected to the second n-type semiconductor layer 331 and a second p-type electrode 344 is formed to be electrically connected to the second p-type semiconductor layer 333, using a photolithography method and a vacuum deposition method.

Lastly, nitride semiconductor light emitting devices are formed by performing chip separation by blade dicing or cleavage (not shown).

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Embodiment 4

Figure 7:
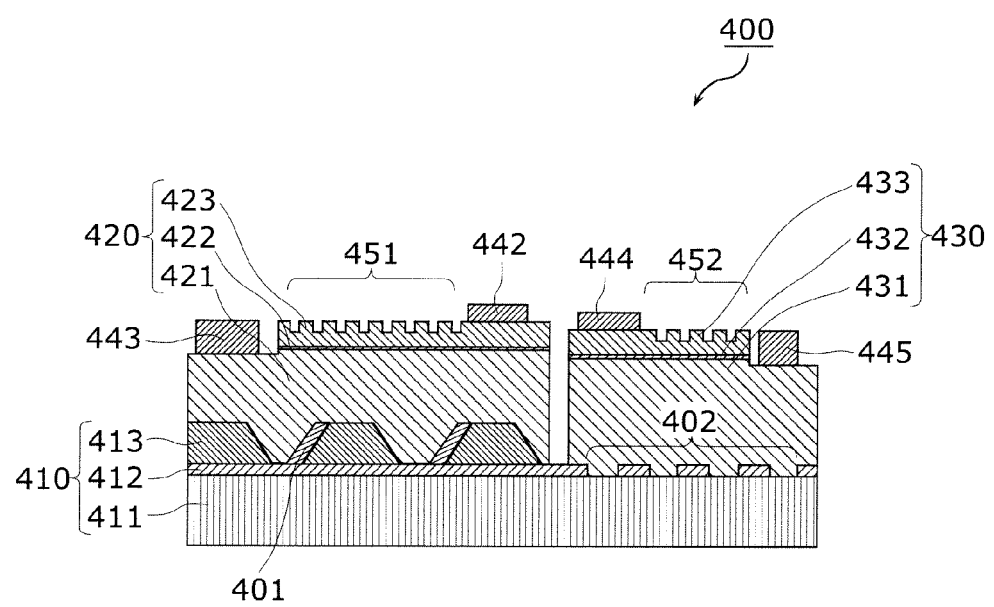
FIG. 7 is a cross-sectional view of a nitride semiconductor light emitting device according to Embodiment 4 of the present invention.

With reference to FIG. 7, a description is given of a nitride semiconductor light emitting device 400 according to Embodiment 4 of the present invention. FIG. 7 is a cross-sectional view of a nitride semiconductor light emitting device 400 according to Embodiment 4 of the present invention.

As shown in FIG. 7, the nitride semiconductor light emitting device 400 according to Embodiment 4 has an uneven substrate 410 having a stack of a first substrate 411 made of a silicon (Si) single crystal, an insulating layer 412, and a second substrate 413 made of a silicon (Si) single crystal stacked in this listed order.

Here, the uneven substrate 410 includes a first area in which the second substrate 413 is formed as a set of island-shaped protrusions in an uneven structure and in which the insulating layer 412 is partly exposed below recesses formed between the protrusions and a second area in which no second substrate 413 is formed and the first substrate 411 is partly exposed below openings formed in the insulating layer 412.

In the first area, among the side surfaces of each protrusion in the uneven structure of the second substrate 413, a first side surface is a (111) silicon plane exposed, and a second side surface is covered with a second mask 401. In addition, the recesses in the uneven structure have bottoms which are parts of the surface of the insulating layer 412. In short, in this embodiment, the bottoms of the recesses are parts of the insulating layer 412.

On the second substrate 413 in the first area, a first nitride semiconductor stack 420 is formed which is a stack of the following layers stacked in the listed order: a first n-type semiconductor layer 421 (a first nitride semiconductor layer); a first light emitting layer 422; and a first p-type semiconductor layer 423 (a second nitride semiconductor layer). The first n-type semiconductor layer 421 fills the recesses in the uneven structure in the first area and finally grows planar and parallel to the main surface of the first substrate 411.

The first nitride semiconductor stack 420 includes openings in which the first n-type semiconductor layer 421 is exposed. A first n-type electrode 443 and a first p-type electrode 442 are formed on the first n-type semiconductor layer 421 and the first p-type semiconductor layer 423, respectively, to be electrically connected to each other.

In this embodiment, a first light emitting surface 451 having an uneven structure in which recesses and protrusions are arranged at regular intervals is additionally formed on the first p-type semiconductor layer 423.

On the other hand, in the second area of the uneven substrate 410, an opening part 402 is formed in the insulating layer 412. The opening part 402 includes a base part and openings which are formed on the base part at regular intervals and in which the planar main surface of the first substrate 411 is exposed.

On the opening part 402 in the second area, a second nitride semiconductor stack 430 is formed which is a stack of the following layers stacked in the listed order: a second n-type semiconductor layer 431 (a third nitride semiconductor layer); a second light emitting layer 432; and a second p-type semiconductor layer 433 (a fourth nitride semiconductor layer).

The second nitride semiconductor stack 430 includes openings in which the second n-type semiconductor layer 431 is exposed. A second n-type electrode 445 and a second p-type electrode 444 are formed on the second n-type semiconductor layer 431 and the second p-type semiconductor layer 433, respectively, to be electrically connected to each other.

In this embodiment, a second light emitting surface 452 having an uneven structure in which recesses and protrusions are arranged at regular intervals is additionally formed on the second p-type semiconductor layer 433.

The first nitride semiconductor stack 420 and the second nitride semiconductor stack 430 are respectively formed on the first area and the second area of the uneven substrate 410, but are insulated by the insulating layer 412 positioned below the first nitride semiconductor stack 420. The first nitride semiconductor stack 420 and the second nitride semiconductor stack 430 are separate devices, and thus each of which emits light having a different center wavelength.

In this device structure, the first nitride semiconductor stack 420 includes: a first p-type semiconductor layer 423 which is for example made of gallium nitride (GaN) doped with magnesium (Mg); a first light emitting layer 422 which is for example a multiple quantum well made of indium gallium nitride (InGaN) and GaN and adjusted to emit blue light having a center wavelength of 470 nm; and a first n-type semiconductor layer 421 which is for example made of GaN doped with silicon (Si). The first p-type electrode 442 is a multilayer film made of metal such as titanium (Ti), aluminum (Al), nickel (Ni), and gold (Au). The first n-type electrode 443 is a multilayer film made of metal such as Ti, Al, Ni, and Au in contact with the first n-type semiconductor layer 421 partly exposed through selective removal of the first p-type semiconductor layer 423 and the first light emitting layer 422.

In this device structure, the second nitride semiconductor stack 430 includes: a second p-type semiconductor layer 433 which is for example made of gallium nitride (GaN) doped with magnesium (Mg); a second light emitting layer 432 which is for example a multiple quantum well made of indium gallium nitride (InGaN) and GaN and adjusted to emit green light having a center wavelength of 530 nm; and a second n-type semiconductor layer 431 which is for example made of GaN doped with silicon (Si). The second p-type electrode 444 is a multilayer film made of metal such as Ti, Al, Ni, and Au. The second n-type electrode 445 is a multilayer film made of metal such as Ti, Al, Ni, and Au in contact with the second n-type semiconductor layer 431 partly exposed through selective removal of the second p-type semiconductor layer 433 and the second light emitting layer 432.

The insulating layer 412 should preferably be made of silicon oxide ($SiO_2$). Preferably, a transparent electrode (not shown) made of indium tin oxide (ITO) should be formed between the first p-type electrode 442 and the first p-type semiconductor layer 423. Preferably, a transparent electrode (not shown) made of ITO should be formed between the second p-type electrode 444 and the second p-type semiconductor layer 433. Furthermore, the transparent electrode (not shown) made of ITO should preferably have an uneven structure.

Preferably, the second substrate has a main surface which is one of a seven-degree off-oriented (100) silicon plane, a (113) silicon plane, a (112) silicon plane, and a (110) silicon plane. In addition, the second substrate 413 preferably should have, as the uneven structure, a periodic structure in which recesses and protrusions are arranged at regular intervals. The opening part 402 may have a periodic structure in which recesses and protrusions are arranged at regular intervals, as in Embodiment 1.

The second mask 401 should preferably be a multilayer film made of a dielectric material such as silicon oxide ($SiO_2$) or a dielectric composition such as SiO2 and titanium oxide ($TiO_2$).

Next, a description is given of operations by the nitride semiconductor light emitting device 400 according to Embodiment 4.

As in Embodiment 3, the nitride semiconductor light emitting device 400 according to Embodiment 4 includes an uneven substrate 410 which includes a first area including an uneven structure and a second area including a planar surface. Accordingly, it is possible to enable the GaN crystals having different plane directions to grow, at narrow intervals, planar and parallel to the main surfaces of the substrates. It is possible to easily create, on the planar surface, a fine electrode pattern for increasing current application or a fine recess-protrusion pattern for increasing light extraction efficiency using general semiconductor manufacturing processes such as a photolithography method and a dry etching method. In this way, it is possible to increase the light emission efficiency of the nitride semiconductor light emitting device. For example, as shown in FIG. 7, a periodic recess-protrusion pattern is formed on each of a first light emitting surface 451 and a second light emitting surface 452. In this case, it is possible to efficiently extract light from the first nitride semiconductor stack 420 and the second nitride semiconductor stack 430. As a result, it is possible to realize a nitride semiconductor light emitting device which provides high light emission efficiency and has a narrow light emission point interval.

As in Embodiment 3, one-time crystal growth makes it possible to manufacture a nitride semiconductor light emitting device having different light wavelength peaks. This is because the different crystal surfaces have a different indium (In) incorporation efficiency.

As in Embodiment 3, a set of the first n-type electrode 443 and the first p-type electrode 442 and a set of the second n-type electrode 445 and the second p-type electrode 444 are formed independently of each other. For this reason, it is possible to manufacture a nitride semiconductor light emitting device capable of independently driving the first nitride semiconductor stack 420 which emits light having a wavelength and the second nitride semiconductor stack 430 which emits light having a different wavelength.

As in Embodiment 3, it is possible to selectively grow the crystalline first nitride semiconductor stack 420 in the first area, and to thereby reduce the piezoelectric field in the first light emitting layer 422. As a result, it is possible to accelerate special separation between electrons and holes in the first light emitting layer 422, and to thereby increase the light emission efficiency.

In addition, since the second substrate 413 is formed to have, as the uneven structure, the periodic structure in which recesses and protrusions are arranged at regular intervals, it is possible to efficiently extract light emitted from the first light emitting layer 422 to outside of the first nitride semiconductor stack 420.

As in Embodiment 3, due to the difference in the crystal growth rate in the direction perpendicular to the substrate between the first area and the second area, the level difference between the two crystal surfaces are smaller than the level difference in the crystal growing stage. Accordingly, it is possible to form a finer pattern, and to thereby realize a nitride semiconductor light emitting device that provides high light emission efficiency.

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Similarly to the nitride semiconductor light emitting device 100 according to Embodiment 1, the nitride semiconductor light emitting device 400 according to this embodiment includes an insulating layer 412 designed to have a thermal expansion coefficient larger than the thermal expansion coefficients of the first n-type semiconductor layer 421 and the second n-type semiconductor layer 431. Thus, it is possible to reduce the possibility that cracks occur in the first n-type semiconductor layer 421 and the second n-type semiconductor layer 431.

Figure 8:
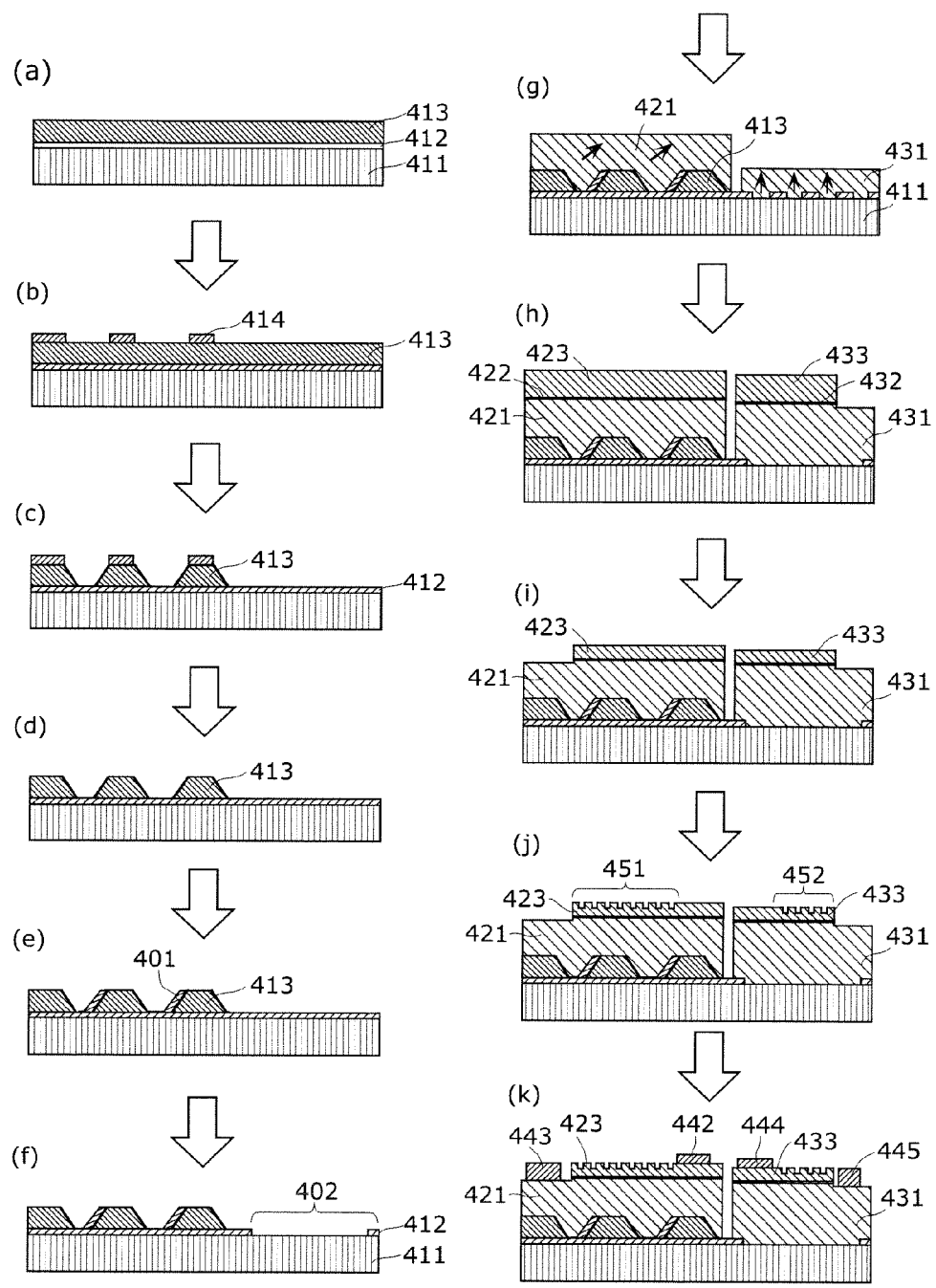
FIG. 8 shows schematic cross-sectional views of the nitride semiconductor light emitting device according to Embodiment 4 of the present invention in processes of a manufacturing method according to the present invention.

With reference to FIG. 8, a description is given of a method of manufacturing the nitride semiconductor light emitting device 400 according to Embodiment 4 of the present invention. FIG. 8 shows schematic cross-sectional views of the nitride semiconductor light emitting device 400 according to Embodiment 4 of the present invention in processes of a manufacturing method according to the present invention.

As shown in (a) of FIG. 8, a first substrate 411 made of a silicon (Si) single crystal and a second substrate 413 made of a silicon (Si) single crystal are bonded through an insulating layer 412 made of silicon oxide ($SiO_2$) or the like. At this time, the second substrate 413 has a main surface different in plane direction from a (111) silicon plane.

Next, a first mask 414 which is one of a silicon oxide film and a silicon nitride film is formed on the second substrate 413 using a thermal oxidation method or a plasma enhanced Chemical Vapor Deposition (CVD) method. Next, as shown in (b) of FIG. 8, patterning is performed on the first mask 414 using a photolithography method and a dry etching method to form stripe-shaped openings which extend in the perpendicular direction in FIG. 8 and in which the second substrate 413 is exposed. In the part to be the second area, the first mask 414 is completely removed by etching.

Next, as shown in (c) of FIG. 8, wet etching using potassium hydroxide (KOH), tetramethylammonium hydroxide (TMAH), or the like is performed on the second substrate 413 to form an uneven structure including island-shaped protrusions in the second substrate 413. In this way, the insulating layer 412 is exposed in the openings of the second substrate 413. At this time, one side surface of each protrusion of the second substrate 413 is a tilted surface which is a (111) silicon plane. The second substrate 413 is completely removed from the part to be the second area.

Next, as shown in (d) of FIG. 8, the first mask 414 is removed by wet etching using hydrofluoric acid (HF) or the like. In this way, it is possible to form an uneven structure in the first area.

Next, as shown in (e) of FIG. 8, among the side surfaces of each protrusion in the uneven structure formed on the second substrate 413, the other side surface is covered by the second mask 401 using a sputtering method or a vacuum deposition method.

Next, as shown in (f) of FIG. 8, an opening part 402 is formed in the insulating layer 412 by selectively removing the insulating layer 412 from the second area in which no uneven structure is left after the removal of the second substrate 413, using a photolithography method or a dry etching method. The opening part 402 includes a base part and openings which are formed on the base part at regular intervals and in which the first substrate 411 is exposed. Here, the opening part 402 may be replaced by an opening part which does not include such a base part and includes penetrating openings arranged therein at regular intervals.

Next, as shown in (g) of FIG. 8, the first n-type semiconductor layer 421 and the second n-type semiconductor layer 431 are formed on the first area having the uneven structure of the second substrate 413 and the second area having the opening part 402, respectively, using the MOCVD method. At this time, in the first area, the crystal growth of the first n-type semiconductor layer 421 is started along the exposed parts of the second substrate 413, more specifically, the main surface of the second substrate 413 and the plane direction (the diagonal arrow direction in the (g) of FIG. 8) of the side surface of each protrusion. Finally, the first n-type semiconductor layer 421 grows planar and parallel to the main surface of the first substrate 411. In addition, in the second area, the crystal growth of the second n-type semiconductor layer 431 is started along the exposed main surface of the first substrate 411 (the upward arrow direction in the (g) of FIG. 8). Finally, the second n-type semiconductor layer 431 grows planar and parallel to the main surface of the first substrate 411. In this case, the second n-type semiconductor layer 431 grows faster in the direction perpendicular to the main surface of the second substrate 413 than the first n-type semiconductor layer 421. Accordingly, as the crystal growth of the two semiconductor layers advances, the level difference between the two crystal surfaces is reduced.

As shown in (h) of FIG. 8, using the MOCVD method, the first light emitting layer 422 and the first p-type semiconductor layer 423 are formed on the first n-type semiconductor layer 421, and the second light emitting layer 432 and the second p-type semiconductor layer 433 are formed on the second n-type semiconductor layer 431.

Next, as shown in (i) of FIG. 8, openings are selectively formed to expose the first n-type semiconductor layer 421 and the second n-type semiconductor layer 431, using a photolithography method and a dry etching method.

Next, as shown in (j) in FIG. 8, using a photolithography method and a dry etching method, a first light emitting surface 451 having recesses and protrusions (a periodic uneven structure) is formed in the first p-type semiconductor layer 423, and a second light emitting surface 452 having recesses and protrusions (a periodic uneven structure) is formed in the second p-type semiconductor layer 433.

Next, as shown in (k) of FIG. 8, a first n-type electrode 443 is formed to be electrically connected to the first n-type semiconductor layer 421 and a first p-type electrode 442 is formed to be electrically connected to the first p-type semiconductor layer 423, using a photolithography method and a vacuum deposition method. Likewise, a second n-type electrode 445 is formed to be electrically connected to the second n-type semiconductor layer 431 and a second p-type electrode 444 is formed to be electrically connected to the second p-type semiconductor layer 433, using a photolithography method and a vacuum deposition method.

Lastly, nitride semiconductor light emitting devices are formed by performing chip separation by blade dicing (not shown).

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Embodiment 5

Figure 9A:
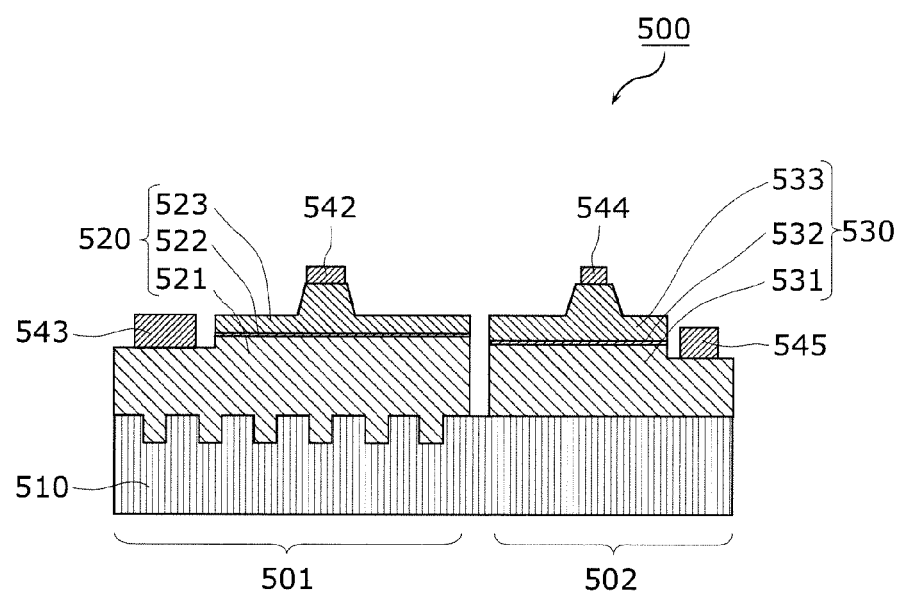
FIG. 9A is a cross-sectional view of a nitride semiconductor light emitting device according to Embodiment 5 of the present invention.
Figure 9B:
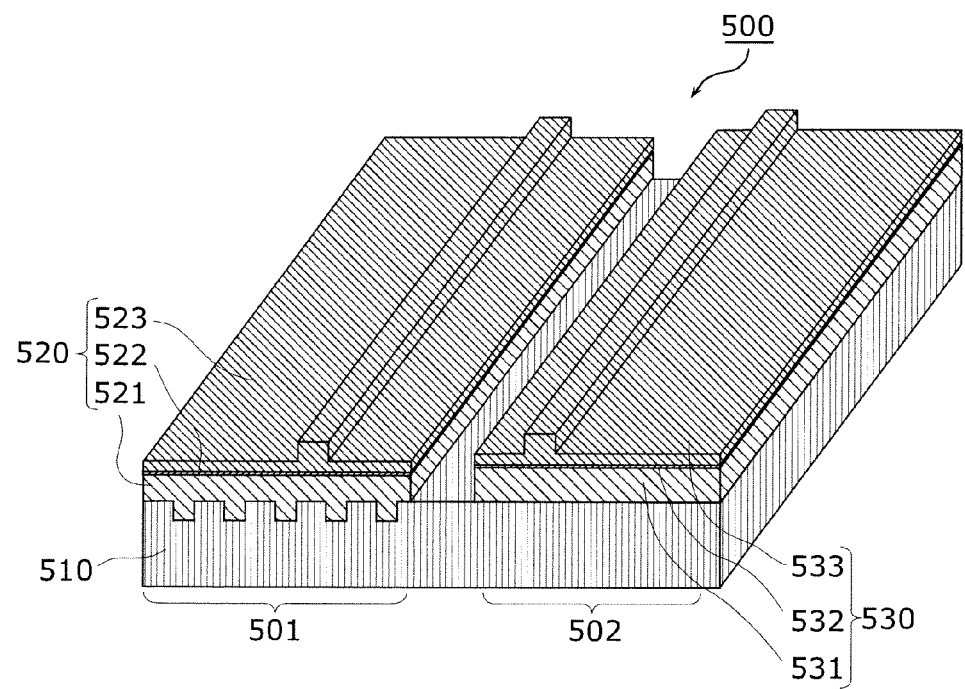
FIG. 9B is a cross-sectional view of the nitride semiconductor light emitting device according to Embodiment 5 of the present invention.

With reference to FIGS. 9A and 9B, a description is given of a nitride semiconductor light emitting device 500 according to Embodiment 5 of the present invention. FIG. 9A is a cross-sectional view of the nitride semiconductor light emitting device 500 according to Embodiment 5. FIG. 9B is a cross-sectional view of the nitride semiconductor light emitting device 500 according to Embodiment 5. FIG. 9B shows the nitride semiconductor light emitting device 500 which is in a process and thus is not provided with a first n-type electrode 543, a first p-type electrode 542, a second n-type electrode 545, and a second p-type electrode 544 as shown in FIG. 9A.

As shown in FIGS. 9A and 9B, the nitride semiconductor light emitting device 500 according to Embodiment 5 includes a sapphire substrate which is an uneven substrate 510 and has a main surface which is a (11-20) plane. The uneven substrate 510 includes a first area 501 having recesses and protrusions (a periodic uneven structure) and a second area 502 which is a planar surface. The uneven structure has protrusions each having a side surface which is a (0001) plane. Each protrusion in the uneven structure is formed by etching the sapphire substrate. Accordingly, in this embodiment, the bottoms of the recesses are the parts of the uneven substrate 510 made of sapphire.

On the first area 501, a first nitride semiconductor stack 520 is formed which is a stack of the following layers stacked in the listed order: a first n-type semiconductor layer 521 (a first nitride semiconductor layer); a first light emitting layer 522; and a first p-type semiconductor layer 523 (a second nitride semiconductor layer). The first n-type semiconductor layer 521 fills the recesses in the uneven structure in the first area 501 and finally grows planar and parallel to the main surface of the uneven substrate 510 made of sapphire.

The first nitride semiconductor stack 520 includes openings in which the first n-type semiconductor layer 521 is exposed. A first n-type electrode 543 and a first p-type electrode 542 are formed on the first n-type semiconductor layer 521 and the first p-type semiconductor layer 523, respectively, to be electrically connected to each other.

A ridge is formed on the first p-type semiconductor layer 523. A high current applied between the first n-type electrode 543 and the first p-type electrode 542 causes the first light emitting layer 522 to emit laser light having a desired wavelength.

On the second area 502, a second nitride semiconductor stack 530 is formed which is a stack of the following layers stacked in this listed order: a second n-type semiconductor layer 531 (a third nitride semiconductor layer); a second light emitting layer 532; and a second p-type semiconductor layer 533 (a fourth nitride semiconductor layer).

The second nitride semiconductor stack 530 includes openings in which the second n-type semiconductor layer 531 is exposed. A second n-type electrode 545 and a second p-type electrode 544 are formed on the second n-type semiconductor layer 531 and the second p-type semiconductor layer 533, respectively, to be electrically connected to each other.

A ridge is formed on the second p-type semiconductor layer 533. A high current applied between the second n-type electrode 545 and the second p-type electrode 544 causes the second light emitting layer 532 to emit laser light having a desired wavelength.

The first nitride semiconductor stack 520 and the second nitride semiconductor stack 530 are respectively formed on the first area 501 and the second area 502 of the uneven substrate 510, but are insulated because the uneven substrate 510 is the sapphire substrate that has an insulation property. The first nitride semiconductor stack 520 and the second nitride semiconductor stack 530 are separate devices, and thus each of which emits light having a different center wavelength.

In this device structure, the first nitride semiconductor stack 520 includes: a first p-type semiconductor layer 523 which is for example made of gallium nitride (GaN) doped with magnesium (Mg); a first light emitting layer 522 which is for example a multiple quantum well made of indium gallium nitride (InGaN) and GaN and adjusted to emit blue light having a center wavelength of 470 nm; and a first n-type semiconductor layer 521 which is for example made of GaN doped with silicon (Si). The first p-type electrode 542 is a multilayer film made of metal such as titanium (Ti), aluminum (Al), nickel (Ni), and gold (Au). The first n-type electrode 543 is a multilayer film made of metal such as Ti, Al, Ni, and Au in contact with the first n-type semiconductor layer 521 partly exposed through selective removal of the first p-type semiconductor layer 523 and the first light emitting layer 522.

In this device structure, the second nitride semiconductor stack 530 includes: a second p-type semiconductor layer 533 which is for example made of gallium nitride (GaN) doped with magnesium (Mg); a second light emitting layer 532 which is for example a multiple quantum well made of indium gallium nitride (InGaN) and GaN and adjusted to emit green light having a center wavelength of 530 nm; and a second n-type semiconductor layer 531 which is for example made of GaN doped with silicon (Si). The second p-type electrode 544 is a multilayer film made of metal such as Ti, Al, Ni, and Au. The second n-type electrode 545 is a multilayer film made of metal such as Ti, Al, Ni, and Au in contact with the second n-type semiconductor layer 531 partly exposed through selective removal of the second p-type semiconductor layer 533 and the second light emitting layer 532.

Preferably, the uneven structure on the first area 501 should have protrusions (or recesses) each having a side surface perpendicular to the main surface of the uneven substrate 510.

Next, a description is given of operations by the nitride semiconductor light emitting device 500 according to Embodiment 5.

In the nitride semiconductor light emitting device 500 according to Embodiment 5, a (1-100) GaN plane grows on the first area 501, and a (0001) GaN plane grows on the second area 502. Accordingly, as in Embodiment 3, it is possible to enable the GaN crystals having different plane directions to grow, at narrow intervals, planar and parallel to the main surfaces of the substrates. It is possible to easily create, on the planar surface, a fine electrode pattern for increasing current application or a fine recess-protrusion pattern for increasing light extraction efficiency using general semiconductor manufacturing processes such as photolithography dry etching. In this way, it is possible to increase the light emission efficiency of the nitride semiconductor light emitting device. As a result, it is possible to realize a nitride semiconductor light emitting device which provides high light emission efficiency and has a narrow light emission point interval.

As in Embodiment 3, one-time crystal growth makes it possible to manufacture a nitride semiconductor light emitting device having different light wavelength peaks. This is because the different crystal surfaces have a different indium (In) incorporation efficiency.

As in Embodiment 3, a set of the first n-type electrode 543 and the first p-type electrode 542 and a set of the second n-type electrode 545 and the second p-type electrode 544 are formed independently of each other. For this reason, it is possible to manufacture a nitride semiconductor light emitting device capable of independently driving the first nitride semiconductor stack 520 which emits light having a wavelength and the second nitride semiconductor stack 530 which emits light having a different wavelength.

As in Embodiment 3, it is possible to selectively grow the crystalline first nitride semiconductor stack 520 in the first area 501, and to thereby reduce the piezoelectric field in the first light emitting layer 522. As a result, it is possible to accelerate special separation between electrons and holes in the first light emitting layer 522, and to thereby increase the light emission efficiency.

As in Embodiment 3, since the uneven structure on the first area 501 of the uneven substrate 510 is formed to be the periodic uneven structure in which recesses and protrusions are arranged at regular intervals, it is possible to efficiently extract light emitted from the first light emitting layer 522 to outside of the first nitride semiconductor stack 520.

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Similarly to the nitride semiconductor light emitting device 100 according to Embodiment 1, the nitride semiconductor light emitting device 500 according to this embodiment includes, in the uneven substrate 510, recesses (having bottoms made of sapphire) designed to have a thermal expansion coefficient larger than the thermal expansion coefficients of the first n-type semiconductor layer 521 and the second n-type semiconductor layer 531. Thus, it is possible to reduce the possibility that cracks occur in the first n-type semiconductor layer 521 and the second n-type semiconductor layer 531.

Figure 10:
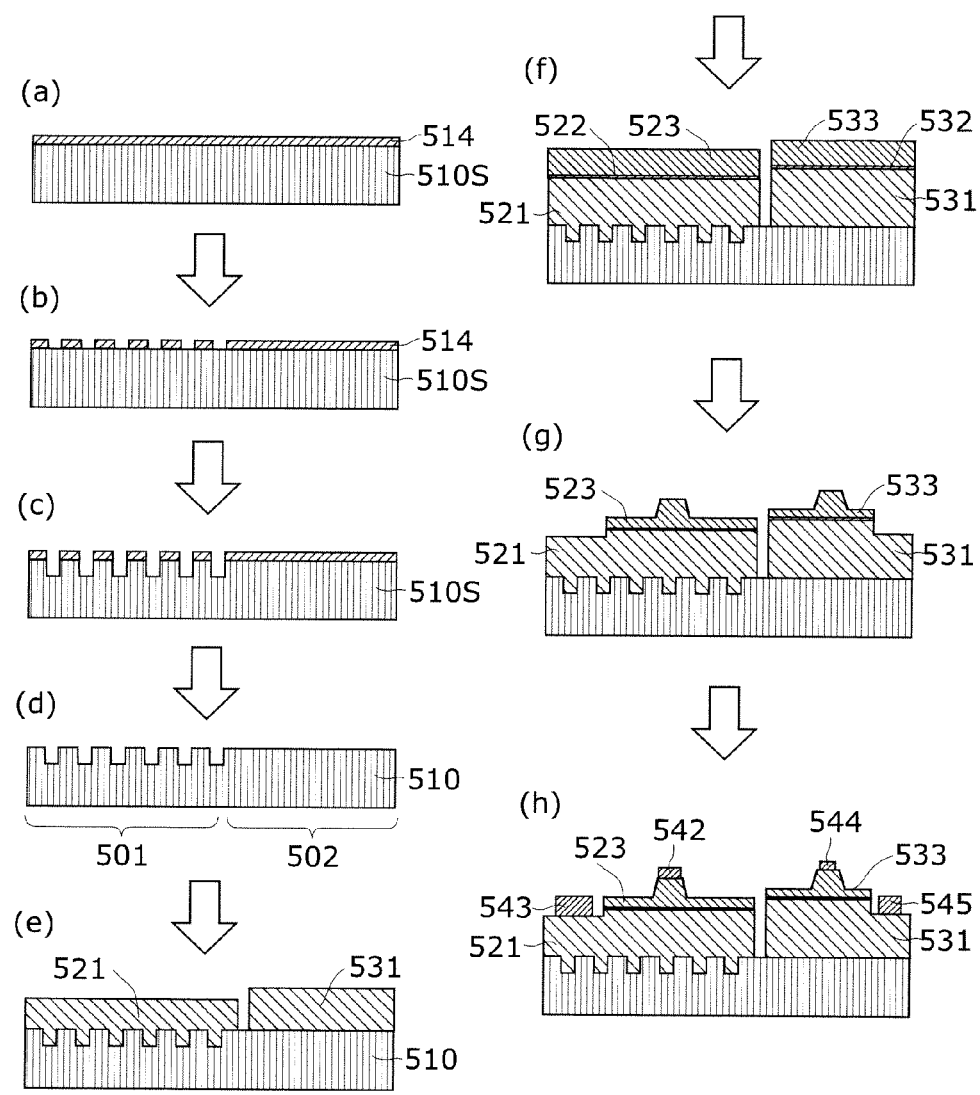
FIG. 10 shows schematic cross-sectional views of the nitride semiconductor light emitting device according to Embodiment 5 of the present invention in processes of a manufacturing method according to the present invention.

With reference to FIG. 10, a description is given of a method of manufacturing the nitride semiconductor light emitting device 500 according to Embodiment 5 of the present invention. FIG. 10 shows schematic cross-sectional views of the nitride semiconductor light emitting device according to Embodiment 5 of the present invention in processes of a manufacturing method according to the present invention.

As shown in (a) of FIG. 10, a mask 514 is formed on a sapphire substrate 510S having a main surface which is a (11-20) plane using a sputtering method or a plasma enhanced Chemical Vapor Deposition (CVD) method.

Next, as shown in (b) of FIG. 10, patterning is performed on a mask 514 using a photolithography method and a dry etching method to form stripe-shaped openings in an area to be a first area 501. In a part to be the second area, no etching is performed on the mask 514.

Next, as shown in (c) of FIG. 10, an uneven structure is formed on the sapphire substrate 510S by dry etching the sapphire substrate 510S. The uneven structure is formed to have protrusions having a side surface which is a (0001) plane.

Next, as shown in (d) of FIG. 10, the mask 514 is removed by wet etching using hydrofluoric acid (HF) or the like. In this way, the uneven substrate 510 is formed to have the first area 501 having the uneven structure and the second area 502 which is a planar surface.

Next, as shown in (e) of FIG. 10, a first n-type semiconductor layer 521 and a second n-type semiconductor layer 531 are formed on the first area 501 and the second area 502, respectively, using a Metal Organic Chemical Vapor Deposition (MOCVD) method. In the first area 501, crystal growth of a first n-type semiconductor layer 521 is started along the plane direction of the uneven structure. Finally, the first n-type semiconductor layer 521 grows planar and parallel to the main surface of the sapphire substrate 510S. In the second area 502, a second n-type semiconductor layer 531 grows planar and parallel to the main surface of the sapphire substrate 510S.

As shown in (f) of FIG. 10, using the MOCVD method, the first light emitting layer 522 and the first p-type semiconductor layer 523 are formed on the first n-type semiconductor layer 521, and the second light emitting layer 532 and the second p-type semiconductor layer 533 are formed on the second n-type semiconductor layer 531.

Next, as shown in (g) of FIG. 10, a ridge is formed on the first p-type semiconductor layer 523 and the second p-type semiconductor layer 533 using a photolithography method and a dry etching method. Likewise, openings are selectively formed in the first n-type semiconductor layer 521 and the second n-type semiconductor layer 531.

Next, as shown in (h) of FIG. 10, a first n-type electrode 543 is formed to be electrically connected to the first n-type semiconductor layer 521 and a first p-type electrode 542 is formed to be electrically connected to the first p-type semiconductor layer 523, using a photolithography method and a vacuum deposition method. Likewise, a second n-type electrode 545 is formed to be electrically connected to the second n-type semiconductor layer 531 and a second p-type electrode 544 is formed to be electrically connected to the second p-type semiconductor layer 533, using a photolithography method and a vacuum deposition method.

Lastly, nitride semiconductor light emitting devices are formed by performing chip separation by blade dicing or cleavage (not shown).

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Embodiment 6

Figure 11:
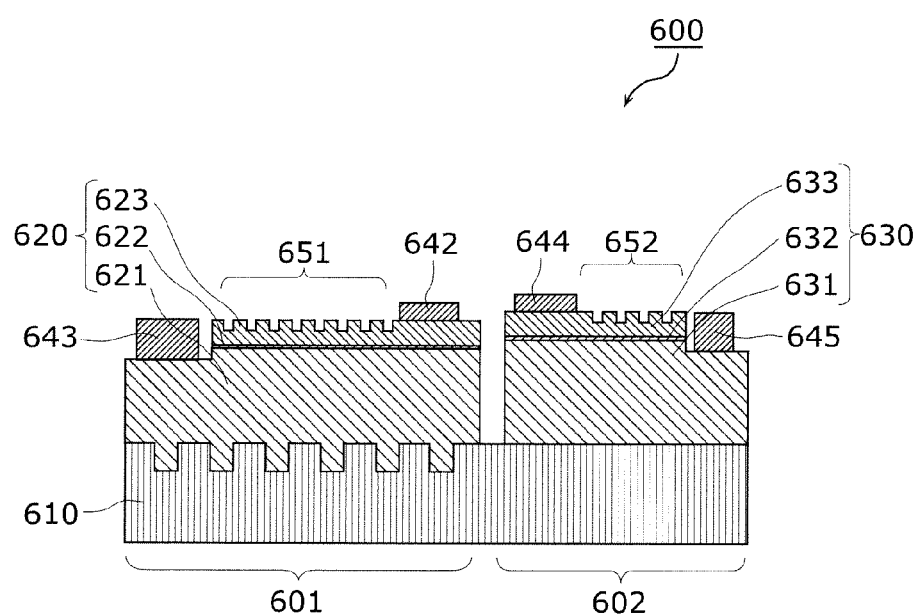
FIG. 11 is a cross-sectional view of a nitride semiconductor light emitting device according to Embodiment 6 of the present invention.

With reference to FIG. 11, a description is given of a nitride semiconductor light emitting device 600 according to Embodiment 6 of the present invention. FIG. 11 is a cross-sectional view of a nitride semiconductor light emitting device 600 according to Embodiment 6 of the present invention.

As shown in FIG. 11, the nitride semiconductor light emitting device 600 according to Embodiment 6 includes a sapphire substrate which is an uneven substrate 610 and has a main surface which is a (11-20) plane. The uneven substrate 610 includes a first area 601 having recesses and protrusions (a periodic uneven structure) and a second area 602 which is a planar surface. The uneven structure has protrusions each having a side surface which is a (0001) plane. Each protrusion in the uneven structure is formed by etching the sapphire substrate. Accordingly, in this embodiment, the bottoms of the recesses are the parts of the uneven substrate 510 made of sapphire.

On the first area 601, a first nitride semiconductor stack 620 is formed which is a stack of the following layers stacked in this listed order: a first n-type semiconductor layer 621 (a first nitride semiconductor layer); a first light emitting layer 622; and a first p-type semiconductor layer 623 (a second nitride semiconductor layer). The first n-type semiconductor layer 621 fills the recesses in the uneven structure in the first area 601 and finally grows planar and parallel to the main surface of the uneven substrate 610 made of sapphire.

The first nitride semiconductor stack 620 includes openings in which the first n-type semiconductor layer 621 is exposed. A first n-type electrode 643 and a first p-type electrode 642 are formed on the first n-type semiconductor layer 621 and the first p-type semiconductor layer 623, respectively, to be electrically connected to each other.

In this embodiment, a first light emitting surface 651 having a periodic uneven structure is additionally formed on the first p-type semiconductor layer 623.

On the second area 602, a second nitride semiconductor stack 630 is formed which is a stack of the following layers stacked in this listed order: a second n-type semiconductor layer 631 (a third nitride semiconductor layer); a second light emitting layer 632; and a second p-type semiconductor layer 633 (a fourth nitride semiconductor layer).

The second nitride semiconductor stack 630 includes openings in which the second n-type semiconductor layer 631 is exposed. A second n-type electrode 645 and a second p-type electrode 644 are formed on the second n-type semiconductor layer 631 and the second p-type semiconductor layer 633, respectively, to be electrically connected to each other.

In this embodiment, a second light emitting surface 652 having a periodic uneven structure is additionally formed on the second p-type semiconductor layer 633.

The first nitride semiconductor stack 620 and the second nitride semiconductor stack 630 are respectively formed on the first area 601 and the second area 602 of the uneven substrate 610, but are insulated because the uneven substrate 610 is the sapphire substrate that has an insulation property. The first nitride semiconductor stack 620 and the second nitride semiconductor stack 630 are separate devices, and thus each of which emits light having a different center wavelength.

In this device structure, the first nitride semiconductor stack 620 includes: a first p-type semiconductor layer 623 which is for example made of gallium nitride (GaN) doped with magnesium (Mg); a first light emitting layer 622 which is for example a multiple quantum well made of indium gallium nitride (InGaN) and GaN and adjusted to emit blue light having a center wavelength of 470 nm; and a first n-type semiconductor layer 621 which is for example made of GaN doped with silicon (Si). The first p-type electrode 642 is a multilayer film made of metal such as titanium (Ti), aluminum (Al), nickel (Ni), and gold (Au). The first n-type electrode 643 is a multilayer film made of metal such as Ti, Al, Ni, and Au in contact with the first n-type semiconductor layer 621 partly exposed through selective removal of the first p-type semiconductor layer 623 and the first light emitting layer 622.

In this device structure, the second nitride semiconductor stack 630 includes: a second p-type semiconductor layer 633 which is for example made of gallium nitride (GaN) doped with magnesium (Mg); a second light emitting layer 632 which is for example a multiple quantum well made of indium gallium nitride (InGaN) and GaN and adjusted to emit green light having a center wavelength of 530 nm; and a second n-type semiconductor layer 631 which is for example made of GaN doped with silicon (Si). The second p-type electrode 644 is a multilayer film made of metal such as Ti, Al, Ni, and Au. The second n-type electrode 645 is a multilayer film made of metal such as Ti, Al, Ni, and Au in contact with the second n-type semiconductor layer 631 partly exposed through selective removal of the second p-type semiconductor layer 633 and the second light emitting layer 632.

Preferably, the uneven structure on the first area 601 should have protrusions (or recesses) each having a side surface perpendicular to the main surface of the uneven substrate 610.

Next, a description is given of operations by the nitride semiconductor light emitting device 600 according to Embodiment 6.

As in Embodiment 5, the nitride semiconductor light emitting element 600 according to Embodiment 6 includes an uneven substrate 610 including a first area 601 having an uneven structure and a second area 602 which is a planar surface. Accordingly, it is possible to enable the GaN crystals having different plane directions to grow, at narrow intervals, planar and parallel to the main surfaces of the substrates. It is possible to easily create, on the planar surface, a fine electrode pattern for increasing current application or a fine recess-protrusion pattern for increasing light extraction efficiency using general semiconductor manufacturing processes such as photolithography and dry etching. In this way, it is possible to increase the light emission efficiency of the nitride semiconductor light emitting device. For example, as shown in FIG. 11, a periodic recess-protrusion pattern is formed on each of a first light emitting surface 651 and a second light emitting surface 652. In this case, it is possible to efficiently extract light from the first nitride semiconductor stack 620 and the second nitride semiconductor stack 630. As a result, it is possible to realize a nitride semiconductor light emitting device which provides high light emission efficiency and has a narrow light emission point interval.

As in Embodiment 3, one-time crystal growth makes it possible to manufacture a nitride semiconductor light emitting device having different light wavelength peaks. This is because the different crystal surfaces have a different indium (In) incorporation efficiency.

As in Embodiment 3, a set of the first n-type electrode 643 and the first p-type electrode 642 and a set of the second n-type electrode 645 and the second p-type electrode 644 are formed independently of each other. For this reason, it is possible to manufacture a nitride semiconductor light emitting device capable of independently driving the first nitride semiconductor stack 620 which emits light having a wavelength and the second nitride semiconductor stack 630 which emits light having a different wavelength.

As in Embodiment 3, it is possible to selectively grow the crystalline first nitride semiconductor stack 620 in the first area 601, and to thereby reduce the piezoelectric field in the first light emitting layer 622. As a result, it is possible to accelerate special separation between electrons and holes in the first light emitting layer 622, and to thereby increase the light emission efficiency.

As in Embodiment 3, since the uneven structure on the first area 601 of the uneven substrate 610 is formed to be the periodic uneven structure in which recesses and protrusions are arranged at regular intervals, it is possible to efficiently extract light emitted from the first light emitting layer 622 to outside of the first nitride semiconductor stack 620.

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Similarly to the nitride semiconductor light emitting device 500 according to Embodiment 5, the nitride semiconductor light emitting device 600 according to this embodiment includes, in the uneven substrate 610, recesses (having bottoms made of sapphire) designed to have a thermal expansion coefficient larger than the thermal expansion coefficients of the first n-type semiconductor layer 621 and the second n-type semiconductor layer 631. Thus, it is possible to reduce the possibility that cracks occur in the first n-type semiconductor layer 621 and the second n-type semiconductor layer 631.

Figure 12:
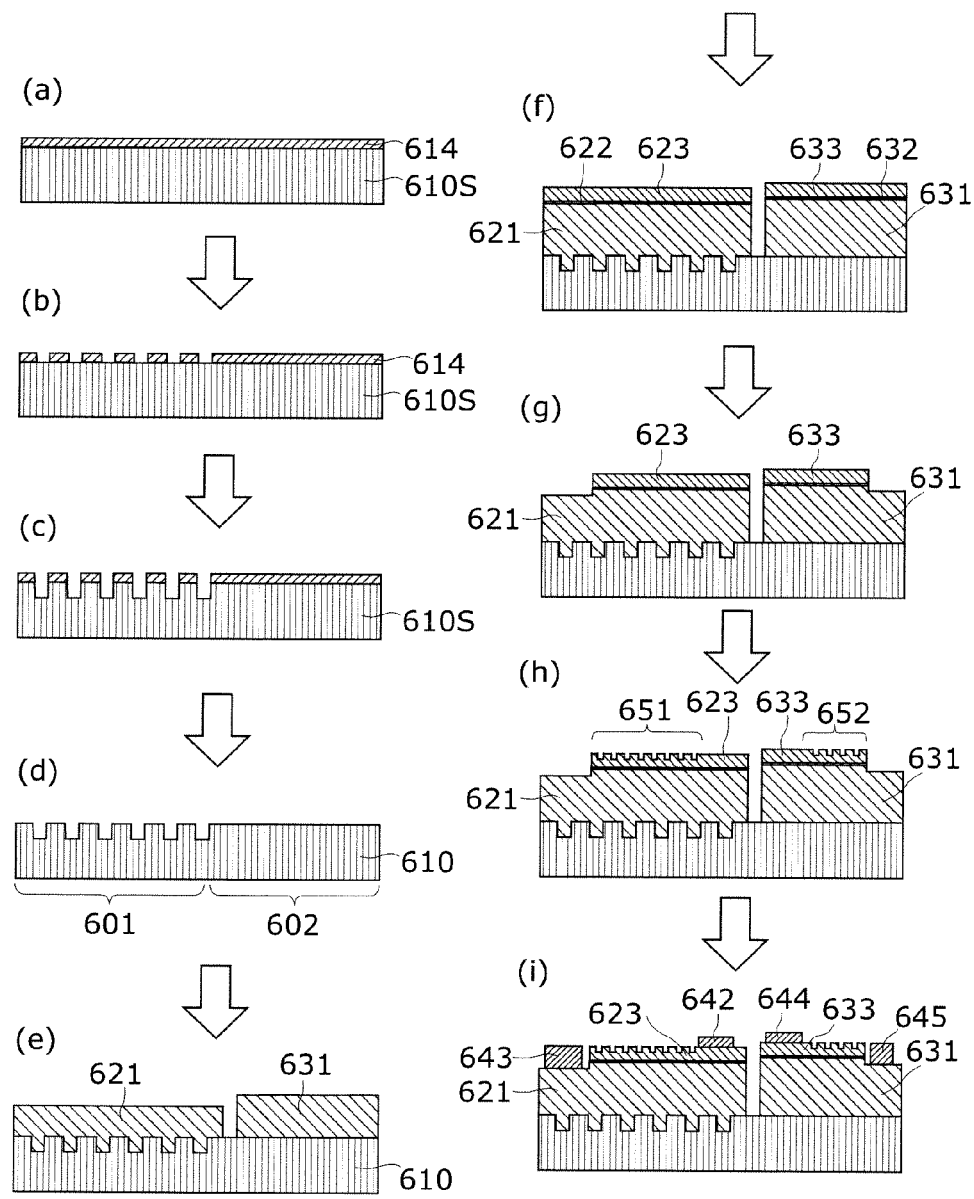
FIG. 12 shows schematic cross-sectional views of the nitride semiconductor light emitting device according to Embodiment 6 of the present invention in processes of a manufacturing method according to the present invention.

With reference to FIG. 12, a description is given of a method of manufacturing the nitride semiconductor light emitting device 600 according to Embodiment 6 of the present invention. FIG. 12 shows schematic cross-sectional views of the nitride semiconductor light emitting device according to Embodiment 6 of the present invention in processes of a manufacturing method according to the present invention.

As shown in (a) of FIG. 12, a mask 614 is formed on a sapphire substrate 610S having a main surface which is a (11-20) plane using a sputtering method or a plasma enhanced Chemical Vapor Deposition (CVD) method.

Next, as shown in (b) of FIG. 12, patterning using a photolithography method and a dry etching method is performed on a mask 614 to form stripe-shaped openings in an area to be a first area 601 of the mask 614 so that a sapphire substrate 610S is exposed in the openings. In a part to be the second area, no etching is performed on the mask 614.

Next, as shown in (c) of FIG. 12, an uneven structure is formed on the sapphire substrate 610S by dry etching the sapphire substrate 610S. The uneven structure is formed to have protrusions having a side surface which is a (0001) plane.

Next, as shown in (d) of FIG. 12, the mask 614 is removed by wet etching using hydrofluoric acid (HF) or the like. In this way, the uneven substrate 610 is formed to have the first area 601 having the uneven structure and the second area 602 which is a planar surface.

Next, as shown in (e) of FIG. 12, a first n-type semiconductor layer 621 and a second n-type semiconductor layer 631 are formed on the first area 601 and the second area 602, respectively, using a Metal Organic Chemical Vapor Deposition (MOCVD) method. In the first area 601, crystal growth of a first n-type semiconductor layer 621 is started along the plane direction of the uneven structure. Finally, the first n-type semiconductor layer 621 grows planar and parallel to the main surface of the sapphire substrate 610S. In the second area 602, a second n-type semiconductor layer 631 grows planar and parallel to the main surface of the sapphire substrate 610S.

As shown in (f) of FIG. 12, using the MOCVD method, the first light emitting layer 622 and the first p-type semiconductor layer 623 are formed on the first n-type semiconductor layer 621, and the second light emitting layer 632 and the second p-type semiconductor layer 633 are formed on the second n-type semiconductor layer 631.

Next, as shown in (g) of FIG. 12, openings are selectively formed to expose the first n-type semiconductor layer 621 and the second n-type semiconductor layer 631, using a photolithography method and a dry etching method.

Next, as shown in (h) in FIG. 12, a first light emitting surface 651 having recesses and protrusions (a periodic uneven structure) is formed in the first p-type semiconductor layer 623, and a second light emitting surface 652 having recesses and protrusions (a periodic structure) is formed in the second p-type semiconductor layer 633, using a photolithography method and a dry etching method.

Next, as shown in (i) of FIG. 12, a first n-type electrode 643 is formed to be electrically connected to the first n-type semiconductor layer 621 and a first p-type electrode 642 is formed to be electrically connected to the first p-type semiconductor layer 623, using a photolithography method and a vacuum deposition method. Likewise, a second n-type electrode 645 is formed to be electrically connected to the second n-type semiconductor layer 631 and a second p-type electrode 644 is formed to be electrically connected to the second p-type semiconductor layer 633, using a photolithography method and a vacuum deposition method.

Lastly, nitride semiconductor light emitting devices are formed by performing chip separation by blade dicing (not shown).

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Embodiment 7

Figure 13A:
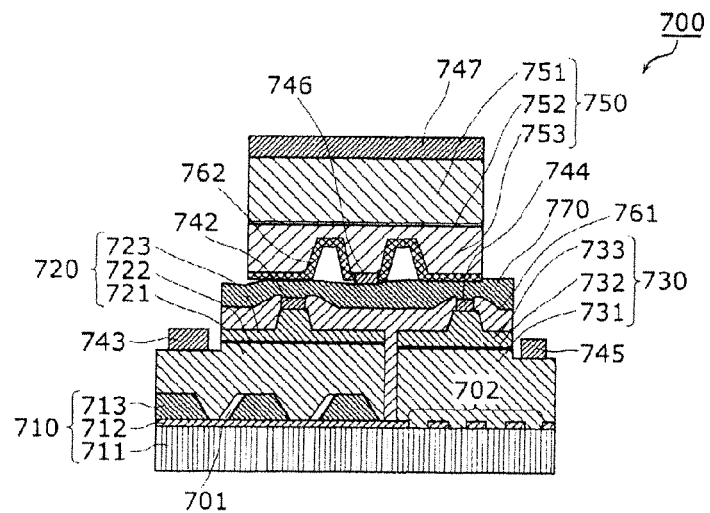
FIG. 13A is a cross-sectional view of a nitride semiconductor light emitting device according to Embodiment 7 of the present invention.
Figure 13B:
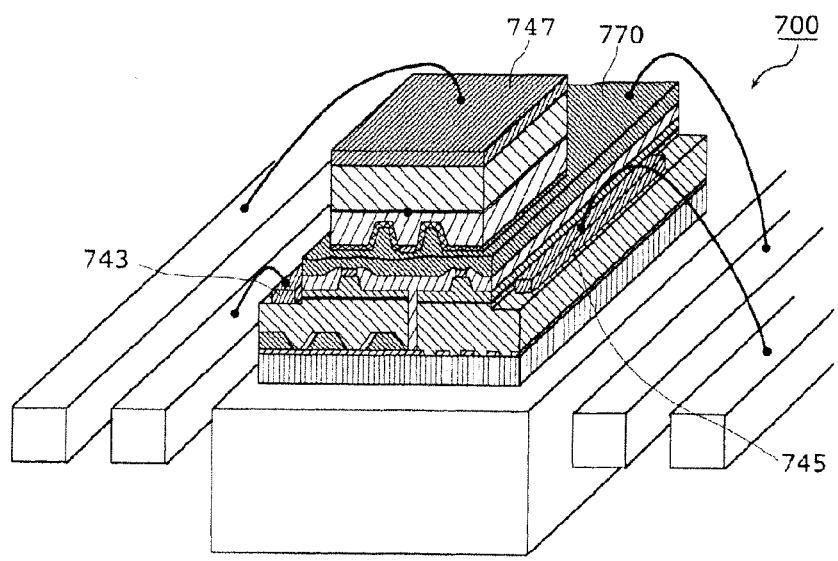
FIG. 13B is a cross-sectional view of the nitride semiconductor light emitting device according to Embodiment 7 of the present invention.

With reference to FIGS. 13A and 13B, a description is given of a nitride semiconductor light emitting device 700 according to Embodiment 7 of the present invention. FIG. 13A is a cross-sectional view of the nitride semiconductor light emitting device 700 according to Embodiment 7. FIG. 13B is a cross-sectional view of the nitride semiconductor light emitting device according to Embodiment 7 of the present invention.

As shown in FIGS. 13A and 13B, the nitride semiconductor light emitting device 700 according to Embodiment 3 includes an uneven substrate 710 which includes a first substrate 711 made of a silicon (Si) single crystal, a first insulating layer 712, and a second substrate 713 made of a silicon (Si) single crystal stacked in this listed order.

Here, the uneven substrate 710 includes a first area in which the second substrate 713 is formed as a set of island-shaped protrusions in an uneven structure and in which the first insulating layer 712 is partly exposed below recesses formed between the protrusions and a second area in which no second substrate 713 is formed and the first substrate 711 is partly exposed below openings formed in the first insulating layer 712.

In the first area, among the side surfaces of each protrusion in the uneven structure of the second substrate 713, a first side surface is a (111) silicon plane exposed, and a second side surface is covered with a second mask 701. The recesses in the uneven structure have bottoms which are parts of the surface of the insulating layer 712. Accordingly, in this embodiment, the bottoms of the recesses are the parts of the first insulating layer 712.

On the second substrate 713 in the first area, a first nitride semiconductor stack 720 is formed which is a stack of the following layers stacked in the listed order: a first n-type semiconductor layer 721 (a first nitride semiconductor layer); a first light emitting layer 722; and a first p-type semiconductor layer 723 (a second nitride semiconductor layer). The first n-type semiconductor layer 721 fills the recesses in the uneven structure in the first area and finally grows planar and parallel to the main surface of the first substrate 711.

The first nitride semiconductor stack 720 includes openings in which the first n-type semiconductor layer 721 is exposed. A first n-type electrode 743 and a first p-type electrode 742 are formed on the first n-type semiconductor layer 721 and the first p-type semiconductor layer 723, respectively, to be electrically connected to each other.

Furthermore, a ridge is formed on the first p-type semiconductor layer 723, and thus a high electric current applied between the first n-type electrode 743 and the first p-type electrode 742 causes the first light emitting layer 722 to emit laser light having a desired wavelength.

On the other hand, in the second area of the uneven substrate 710, an opening part 702 is formed in the first insulating layer 712. The opening part 702 includes penetrating openings which are arranged therein at regular intervals and in which the planer planar main surface of the first substrate 711 is exposed.

On the opening part 702 in the second area, a second nitride semiconductor stack 730 is formed which is a stack of the following layers stacked in this listed order: a second n-type semiconductor layer 731 (a third nitride semiconductor layer); a second light emitting layer 732; and a second p-type semiconductor layer 733 (a fourth nitride semiconductor layer).

The second nitride semiconductor stack 730 includes openings in which the second n-type semiconductor layer 731 is exposed. A second n-type electrode 745 and a second p-type electrode 744 are formed on the second n-type semiconductor layer 731 and the second p-type semiconductor layer 733, respectively, to be electrically connected to each other.

Furthermore, a ridge is formed on the second p-type semiconductor layer 733, and thus a high electric current applied between the second n-type electrode 745 and the second p-type electrode 744 causes the first light emitting layer 732 to emit laser light having a desired wavelength.

The first nitride semiconductor stack 720 and the second nitride semiconductor stack 730 are respectively formed on the first area and the second area of the uneven substrate 710, but are insulated by the first insulating layer 712 positioned below the first nitride semiconductor stack 720. The first nitride semiconductor stack 720 and the second nitride semiconductor stack 730 are separate devices, and thus each of which emits light having a different center wavelength.

In this embodiment, a second insulating layer 761 is formed to cover the first p-type semiconductor layer 723 and the second p-type semiconductor layer 733. On the second insulating layer 761, a common p-type electrode 770 is formed to electrically connect the first p-type electrode 742 and the second p-type electrode 744. The second insulating layer 761 also covers an area in which the first nitride semiconductor stack 720 is formed and an area in which the second nitride semiconductor stack 730 is formed.

On the common p-electrode 770, a third p-type electrode 746 is formed to be electrically connected to the common p-type electrode 770. On the remaining part of the common electrode 770 without the third p-type electrode 746, a third insulating layer 762 is formed. Onto the third insulating layer 762, a third nitride semiconductor stack 750 is bonded which is a stack of the following layers stacked in this listed order: a third n-type semiconductor layer 751 (a fifth nitride semiconductor layer); a third light emitting layer 752; and a third p-type semiconductor layer 753 (a sixth nitride semiconductor layer) which includes a ridge formed thereon. A third n-type electrode 747 is formed to be electrically connected to the third n-type semiconductor layer 751. In other words, in this embodiment, the third nitride semiconductor stack 750 is stacked on the first nitride semiconductor stack 720 and the second nitride semiconductor stack 730, and the three semiconductor layers have different center wavelength.

As shown in FIG. 13B, the first n-type electrode 743, the second n-type electrode 745, the common p-type electrode 770, and the third n-type electrode 747 are electrically connected to predetermined wiring by wire bonding or the like so as to enable these electrodes to supply voltage independently of each other.

In this device structure, the first nitride semiconductor stack 720 includes: a first p-type semiconductor layer 723 which is for example made of gallium nitride (GaN) doped with magnesium (Mg); a first light emitting layer 722 which is for example a multiple quantum well made of indium gallium nitride (InGaN) and GaN and adjusted to emit blue light having a center wavelength of 470 nm; and a first n-type semiconductor layer 721 which is for example made of GaN doped with silicon (Si). The first p-type electrode 742 is a multilayer film made of metal such as titanium (Ti), aluminum (Al), nickel (Ni), and gold (Au). The first n-type electrode 743 is a multilayer film made of metal such as Ti, Al, Ni, and Au in contact with the first n-type semiconductor layer 721 partly exposed through selective removal of the first p-type semiconductor layer 723 and the first light emitting layer 722.

The second mask 701 should preferably be a multilayer film made of a dielectric material such as silicon oxide ($SiO_2$) or a dielectric composition such as $SiO_2$ and titanium oxide ($TiO_2$).

In this device structure, the second nitride semiconductor stack 730 includes: a second p-type semiconductor layer 733 which is for example made of gallium nitride (GaN) doped with magnesium (Mg); a second light emitting layer 732 which is for example a multiple quantum well made of indium gallium nitride (InGaN) and GaN and adjusted to emit green light having a center wavelength of 530 nm; and a second n-type semiconductor layer 731 which is for example made of GaN doped with silicon (Si). The second p-type electrode 744 is a multilayer film made of metal such as Ti, Al, Ni, and Au. The second n-type electrode 745 is a multilayer film made of metal such as Ti, Al, Ni, and Au in contact with the second n-type semiconductor layer 731 partly exposed through selective removal of the second p-type semiconductor layer 733 and the second light emitting layer 732.

In this device structure, the third nitride semiconductor stack 750 includes: a third p-type semiconductor layer 753 which is for example made of gallium arsenide phosphide (GaAs) doped with zinc (Zn); a third light emitting layer 752 which is for example a multiple quantum well made of aluminium gallium indium phosphide (AlGaInP) and GaAs and adjusted to emit red light having a center wavelength of 660 nm; and a third n-type semiconductor layer 751 which is for example made of GaAs doped with silicon (Si). The common p-type electrode 770 and the third p-type semiconductor layer 753 are bonded to each other.

Next, a description is given of operations by the nitride semiconductor light emitting device 700 according to Embodiment 7.

The nitride semiconductor light emitting device 700 according to Embodiment 7 further includes a semiconductor light emitting device which emits light in a red region stacked on the nitride semiconductor light emitting device 300 according to Embodiment 3. Thus, the nitride semiconductor light emitting device 700 can provide the same advantageous effect as the nitride semiconductor light emitting device 300 according to Embodiment 3, and furthermore can emit light having a third wavelength. In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

Similarly to the nitride semiconductor light emitting device 100 according to Embodiment 1, the nitride semiconductor light emitting device 700 according to this embodiment includes a first insulating layer 712 designed to have a thermal expansion coefficient larger than the thermal expansion coefficients of the first n-type semiconductor layer 721 and the second n-type semiconductor layer 731. Thus, it is possible to reduce the possibility that cracks occur in the first n-type semiconductor layer 721 and the second n-type semiconductor layer 731.

Embodiment 8

Figure 14:
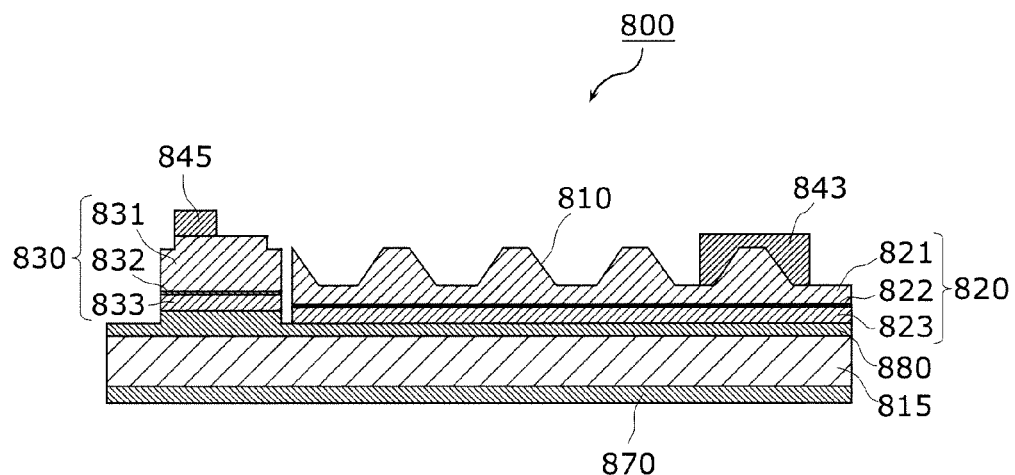
FIG. 14 is a cross-sectional view of a nitride semiconductor light emitting device according to Embodiment 8 of the present invention.

With reference to FIG. 14, a description is given of a nitride semiconductor light emitting device 800 according to Embodiment 8 of the present invention. FIG. 14 is a cross-sectional view of a nitride semiconductor light emitting device 800 according to Embodiment 8 of the present invention.

As shown in FIG. 14, the nitride semiconductor light emitting device 800 according to Embodiment 8 includes a common reflection layer 880 formed on a third substrate 815. On the common reflection layer 880, a first nitride semiconductor stack 820 and a second nitride semiconductor stack 830 are formed. The first nitride semiconductor stack 820 includes the following layers stacked in the listed order: a first p-type semiconductor layer 823 (a second nitride semiconductor layer), a first light emitting layer 822, and a first n-type semiconductor layer 821 (a first nitride semiconductor layer). The second nitride semiconductor stack 830 includes the following layers stacked in the listed order: a second p-type semiconductor layer 833 (a fourth nitride semiconductor layer), a second light emitting layer 832, and a second n-type semiconductor layer 831 (a third nitride semiconductor layer).

The first n-type semiconductor layer 821 in the first nitride semiconductor stack 820 includes an uneven surface 810 having recesses and protrusions. A first n-type electrode 843 is formed on the first n-type semiconductor layer 821 for electrical connection.

A second n-type electrode 845 is formed, for electrical connection, on the second n-type semiconductor layer 831 in the second nitride semiconductor stack 830.

In addition, the third substrate 815 has a surface on which the common reflection layer 880 is formed and an opposite surface on which a common p-type electrode 870 is formed.

In this device structure, the first nitride semiconductor stack 820 includes: a first p-type semiconductor layer 823 which is for example made of gallium nitride (GaN) doped with magnesium (Mg); a first light emitting layer 822 which is for example a multiple quantum well made of indium gallium nitride (InGaN) and GaN and adjusted to emit blue light having a center wavelength of 470 nm; and a first n-type semiconductor layer 821 which is for example made of GaN doped with silicon (Si). The first n-type electrode 843 is a multilayer film made of metal such as Ti, Al, Ni, and Au formed in contact with the first n-type semiconductor layer 821.

In this device structure, the second nitride semiconductor stack 830 includes: a second p-type semiconductor layer 833 which is for example made of gallium nitride (GaN) doped with magnesium (Mg); a second light emitting layer 832 which is for example a multiple quantum well made of indium gallium nitride (InGaN) and GaN and adjusted to emit green light having a center wavelength of 530 nm; and a second n-type semiconductor layer 831 which is for example made of GaN doped with silicon (Si). The second n-type electrode 845 is a multilayer film made of metal such as Ti, Al, Ni, and Au formed in contact with the second n-type semiconductor layer 831.

Figure 15A:
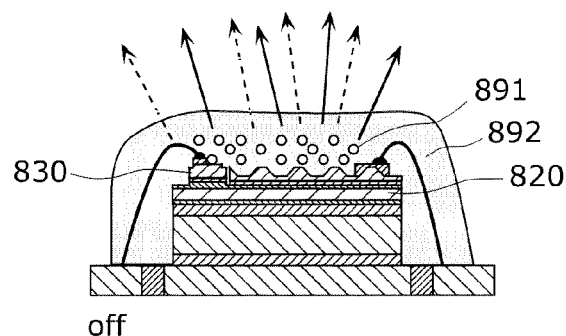
FIG. 15A is a cross-sectional view of the nitride semiconductor light emitting device according to Embodiment 8 of the present invention in the case where only a first nitride semiconductor stack is in operation (according to the operation mode A).
Figure 15B:
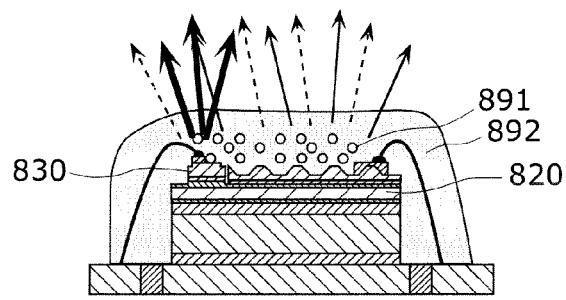
FIG. 15B is a cross-sectional view of the nitride semiconductor light emitting device according to Embodiment 8 of the present invention in the case where both the first nitride semiconductor stack and a second nitride semiconductor stack are in operation (according to the operation mode B).
Figure 15C:
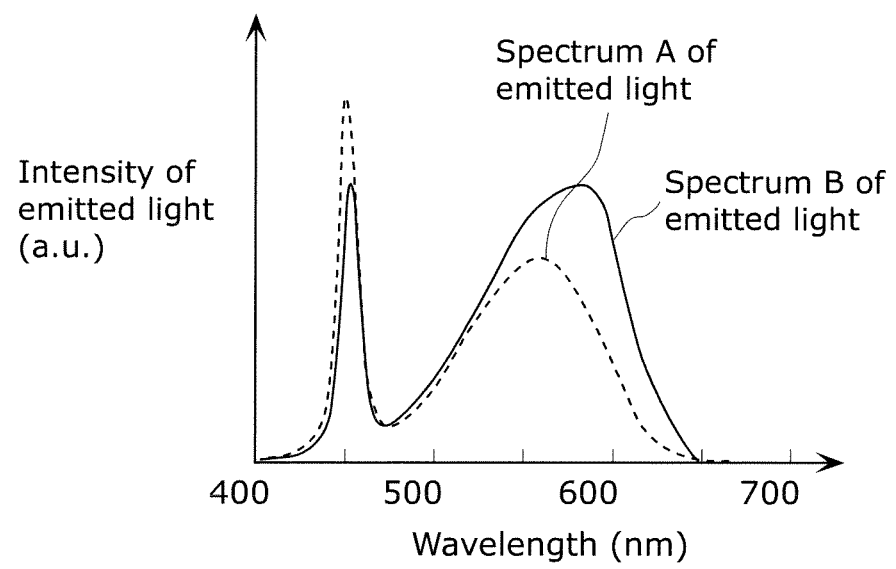
FIG. 15C is a graph in which the broken line shows the spectrum A of the light emitted according to the operation mode A in FIG. 15A and the solid line shows the spectrum B of the light emitted according to the operation mode B in FIG. 15B.

Next, a description is given of operations by the nitride semiconductor light emitting device 800 according to Embodiment 8. FIG. 15A is a cross-sectional view of the nitride semiconductor light emitting device according to Embodiment 8 in the case where only the first nitride semiconductor stack 820 is in operation (according to the operation mode A). FIG. 15B is a cross-sectional view of the nitride semiconductor light emitting device according to Embodiment 8 in the case where both the first nitride semiconductor stack 820 and the second nitride semiconductor stack 830 are in operation (according to the operation mode B). FIG. 15C is a graph in which the broken line shows the spectrum A of the light emitted according to the operation mode A and the solid line shows the spectrum B of the light emitted according to the operation mode B.

In FIGS. 15A and 15B, the nitride semiconductor light emitting device 800 is sealed with resin 892 containing phosphor 891 which converts blue light into yellow light.

As shown in FIG. 15A, in the operation mode A, the first nitride semiconductor stack 820 emits blue light and yellow light converted from the blue light by the phosphor. In this case, as shown in FIG. 15C, the spectrum A of the emitted light has weak light intensity in the red region, which leads to reduction in color rendering.

As shown in FIG. 15B, in the operation mode B, the first nitride semiconductor stack 820 emits blue light, the first nitride semiconductor stack 830 emits light having a wavelength longer than the wavelength of the blue light. The blue light is converted into yellow light by the phosphor, and the yellow light is emitted. In this case, as shown in FIG. 15C, the spectrum B contains a larger amount of light in the red region than spectrum A, with increased color rendering.

In other words, the conventional nitride semiconductor light emitting device can operate only in the operation mode A resulting in low color rendering, but this embodiment of the present invention can operate also in the operation mode B resulting in excellent color rendering. Therefore, the present invention can realize a nitride semiconductor light emitting device which achieves excellent color rendering. Furthermore, according to this embodiment, it is possible to achieve desired color rendering by the nitride semiconductor light emitting device by independently controlling the first nitride semiconductor stack 820 and the second nitride semiconductor stack 830.

Figure 16:
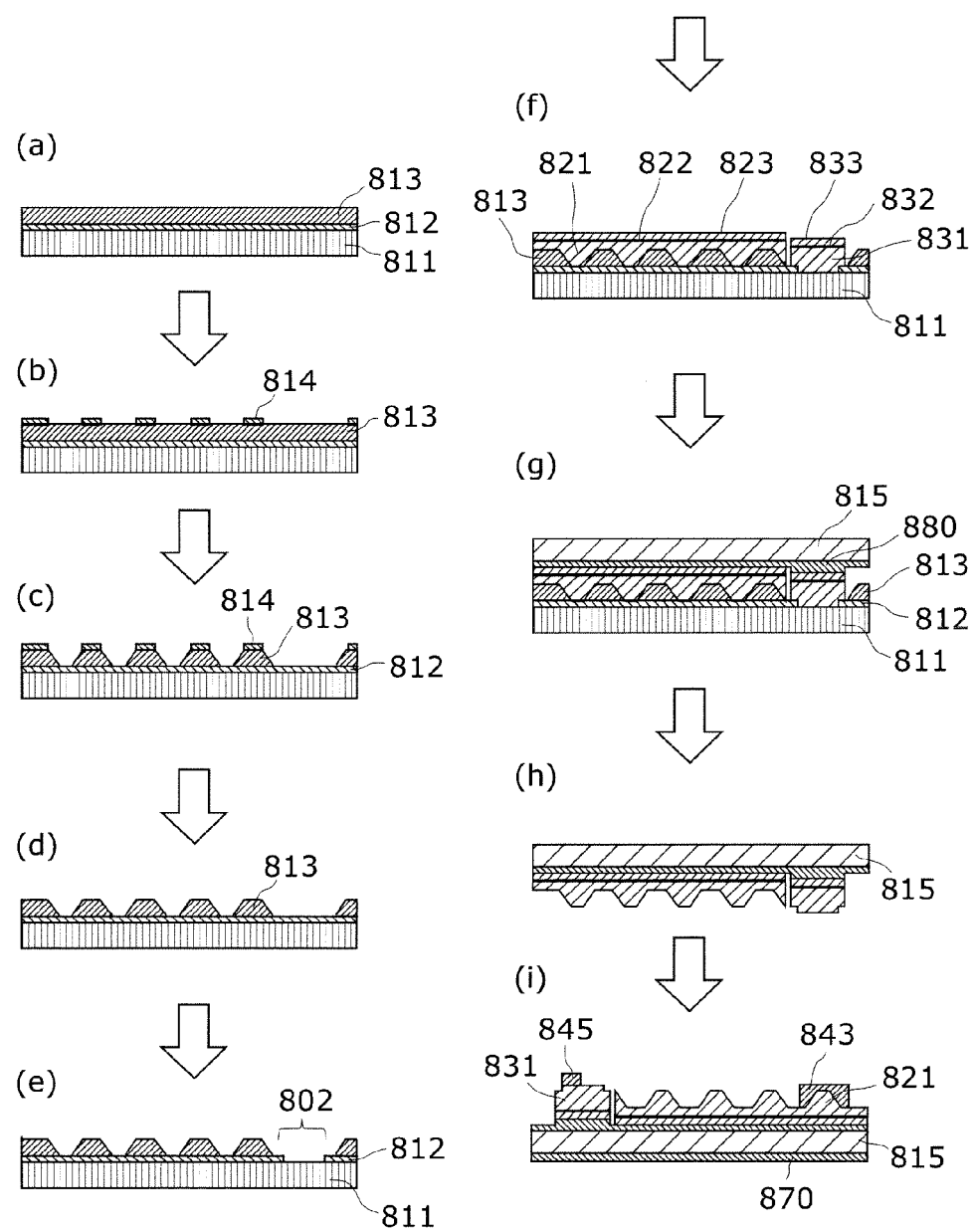
FIG. 16 shows schematic cross-sectional views of the nitride semiconductor light emitting device according to Embodiment 8 of the present invention in processes of a manufacturing method according to the present invention.

With reference to FIG. 16, a description is given of a method of manufacturing the nitride semiconductor light emitting device 800 according to Embodiment 8 of the present invention. FIG. 16 shows schematic cross-sectional views of the nitride semiconductor light emitting device according to Embodiment 8 of the present invention in processes of a manufacturing method according to the present invention.

As shown in (a) of FIG. 16, a first substrate 811 made of a silicon (Si) single crystal and a second substrate 813 made of a silicon (Si) single crystal are bonded through an insulating layer 812 made of silicon oxide ($SiO_2$) or the like. At this time, the second substrate 813 has a main surface different in plane direction from a (111) silicon plane.

Next, a first mask 814 which is one of a silicon oxide film and a silicon nitride film is formed on the second substrate 813 using a thermal oxidation method or a plasma enhanced Chemical Vapor Deposition (CVD) method. Next, as shown in (b) of FIG. 16, patterning is performed on a first mask 814 using a photolithography method and a dry etching method to form stripe-shaped openings which extend in the perpendicular direction in FIG. 16 and in which the second substrate 813 is exposed.

Next, as shown in (c) of FIG. 16, wet etching using potassium hydroxide (KOH), tetramethylammonium hydroxide (TMAH), or the like is performed on the second substrate 813 to form an uneven structure including island-shaped protrusions in the second substrate 813. In this way, the insulating layer 812 is exposed in the openings of the second substrate 813. At this time, one side surface of each protrusion of the second substrate 813 is a tilted surface which is a (111) silicon plane.

Next, as shown in (d) of FIG. 16, the mask 814 is removed by wet etching using hydrofluoric acid (HF) or the like. Next, among the side surfaces of each protrusion in the uneven structure formed on the second substrate 813, a second side surface is covered by a mask (not shown) using a sputtering method or a vacuum deposition method.

Next, as shown in (e) of FIG. 16, the openings in the opening part 802 are formed in the insulating layer 812 using a photolithography method and a dry etching method, so that the first substrate 811 is exposed in the openings.

Next, as shown in (f) of FIG. 16, using the MOCVD method, the first n-type semiconductor layer 821 and the second n-type semiconductor layer 831 are formed on the first area having the uneven structure of the second substrate 813 and the second area having the opening area 802, respectively. In the first area, the crystal growth of the first n-type semiconductor layer 821 is started along the main surface of the second substrate 813 and the plane direction of the side surface of each protrusion. Finally, the first n-type semiconductor layer 821 grows planar and parallel to the main surface of the first substrate 811. In addition, in the second area, the crystal growth of the second n-type semiconductor layer 831 is started along the exposed main surface of the first substrate 811. Finally, the second n-type semiconductor layer 831 grows planar and parallel to the main surface of the first substrate 811. In this case, the second n-type semiconductor layer 831 grows faster in the direction perpendicular to the main surface of the second substrate 813 than the first n-type semiconductor layer 821. Accordingly, as the crystal growth of the two semiconductor layers advances, the level difference between the two crystal surfaces is reduced.

Next, using the MOCVD method, the first light emitting layer 822 and the first p-type semiconductor layer 823 are formed on the first n-type semiconductor layer 821, and the second light emitting layer 832 and the second p-type semiconductor layer 833 are formed on the second n-type semiconductor layer 831.

Next, as shown in (g) of FIG. 16, a third substrate 815 made of germanium (Ge) or the like is bonded, via a common reflection layer 880 made of aluminum (Al), silver (Ag), or the like, to cover the first p-type semiconductor layer 823 and the second p-type semiconductor layer 833.

Next, as shown in (h) of FIG. 16, the first substrate 811, the insulating layer 812, and the second substrate 813 are removed by wet etching using nitric-hydrofluoric acid or dry etching using a chlorine trifluoride ($ClF_3$) gas.

Next, as shown in (i) of FIG. 16, the semiconductor device shown in (h) of FIG. 16 is turned upside down, a first n-type electrode 843 is formed to be electrically connected to the first n-type semiconductor layer 821 and a second n-type electrode 845 is formed to be electrically connected to the second p-type semiconductor layer 831, using a photolithography method and a vacuum deposition method. Next, a common p-type electrode 870 is formed on the back surface of the third substrate 815 using a vacuum deposition method.

Lastly, nitride semiconductor light emitting devices are formed by performing chip separation by blade dicing or cleavage (not shown).

In this way, it is possible to realize a nitride semiconductor light emitting device which (i) provides high light emission efficiency, (ii) has a narrow light emission interval and has a plurality of light wavelengths having different peak wavelengths, and (iii) is capable of independently driving emission of light beams having different wavelength peaks.

The nitride semiconductor light emitting device according to this embodiment is manufactured by forming the uneven structure in the second substrate 813 using the substrate including the first substrate 811, the insulating layer 812, and the second substrate 813, and then forming the uneven surface 810 in the first n-type semiconductor layer 821 using the uneven structure. However, such details in this embodiment are exemplary.

For example, as in Embodiment 5 described with reference to FIG. 9A etc. or in Embodiment 6 described with reference to FIG. 11 etc., it is also possible to form an uneven structure in the sapphire substrate and then form a recess-protrusion surface 810 in the first n-type semiconductor layer 821.

In this case, on the area which is of the sapphire substrate and in which the uneven structure of the sapphire substrate is formed, the first nitride semiconductor substrate including the n-type semiconductor layer is formed, and on the remaining area without the uneven structure, the second nitride semiconductor layer including the second n-type semiconductor layer is formed. Next, the third substrate 815 is bonded as described above, and then the sapphire substrate is removed.

APPLICATION EXAMPLES

Figure 17A:
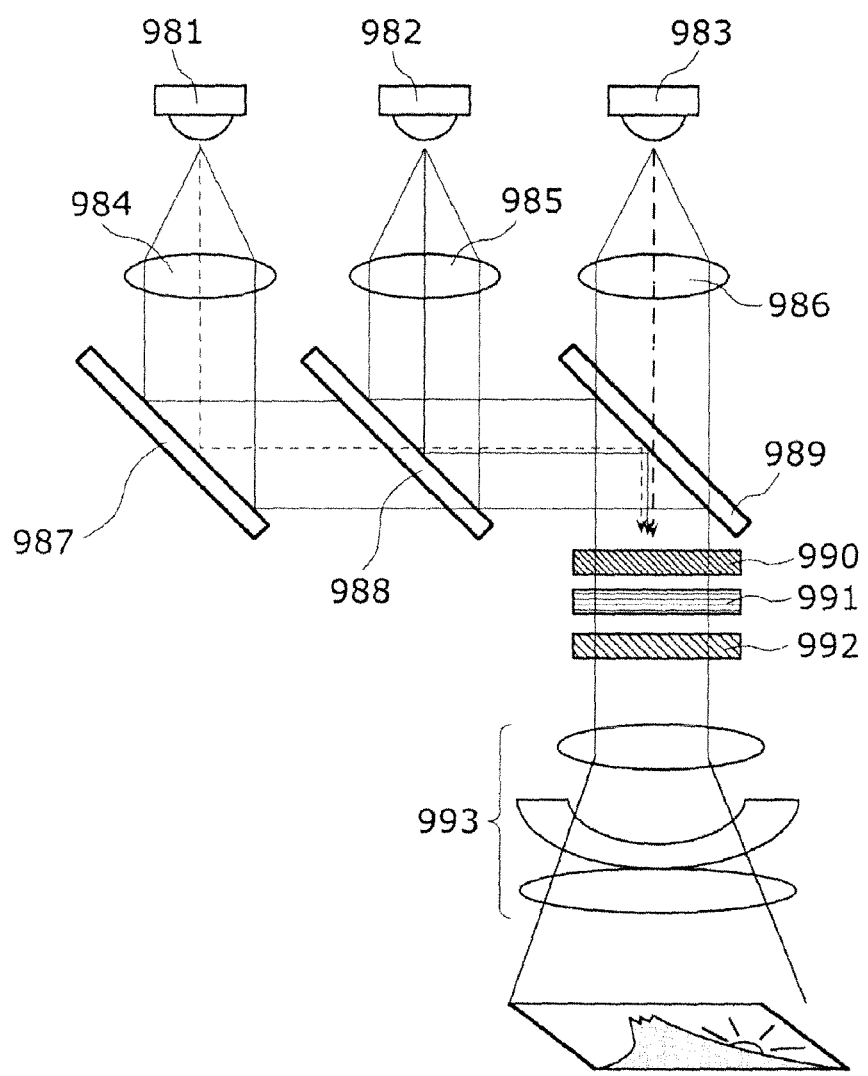
FIG. 17A is an illustration for explaining an application example of a nitride semiconductor light emitting device according to a comparison example.
Figure 17B:
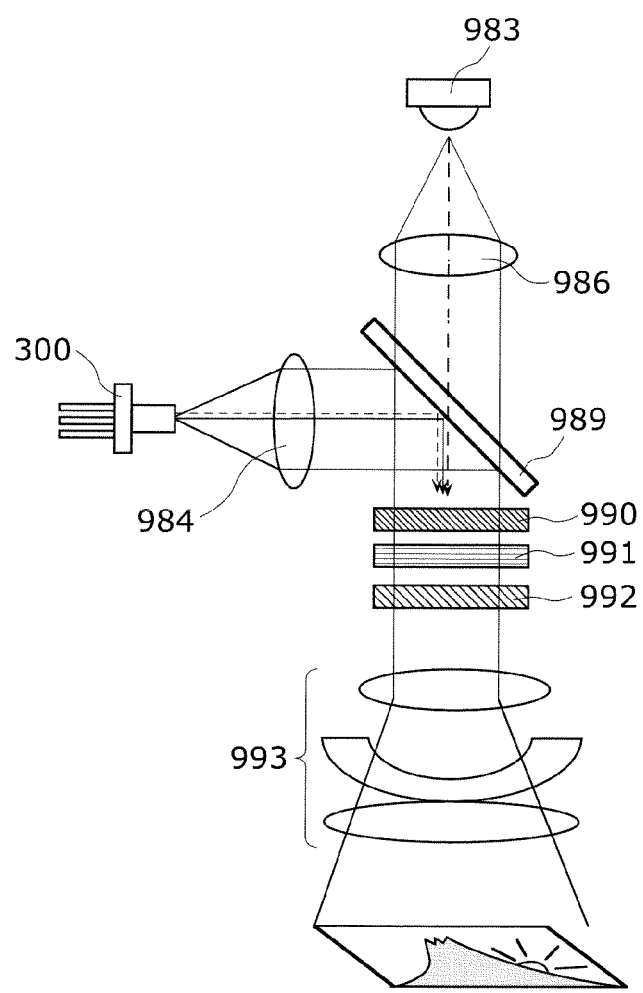
FIG. 17B is an illustration for explaining a first application example of the nitride semiconductor light emitting device according to Embodiment 3 of the present invention.
Figure 17C:
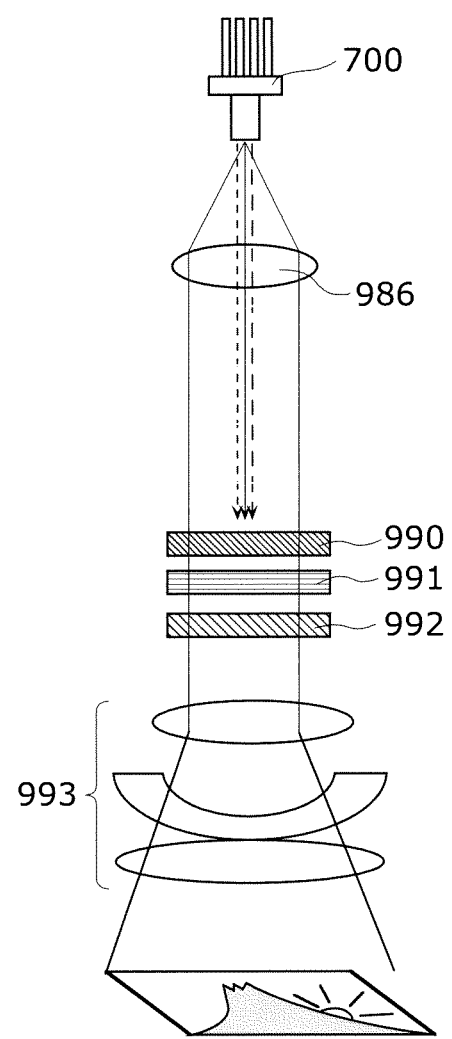
FIG. 17C is an illustration for explaining a second application example of the nitride semiconductor light emitting device according to Embodiment 7 of the present invention.
Figure 18:
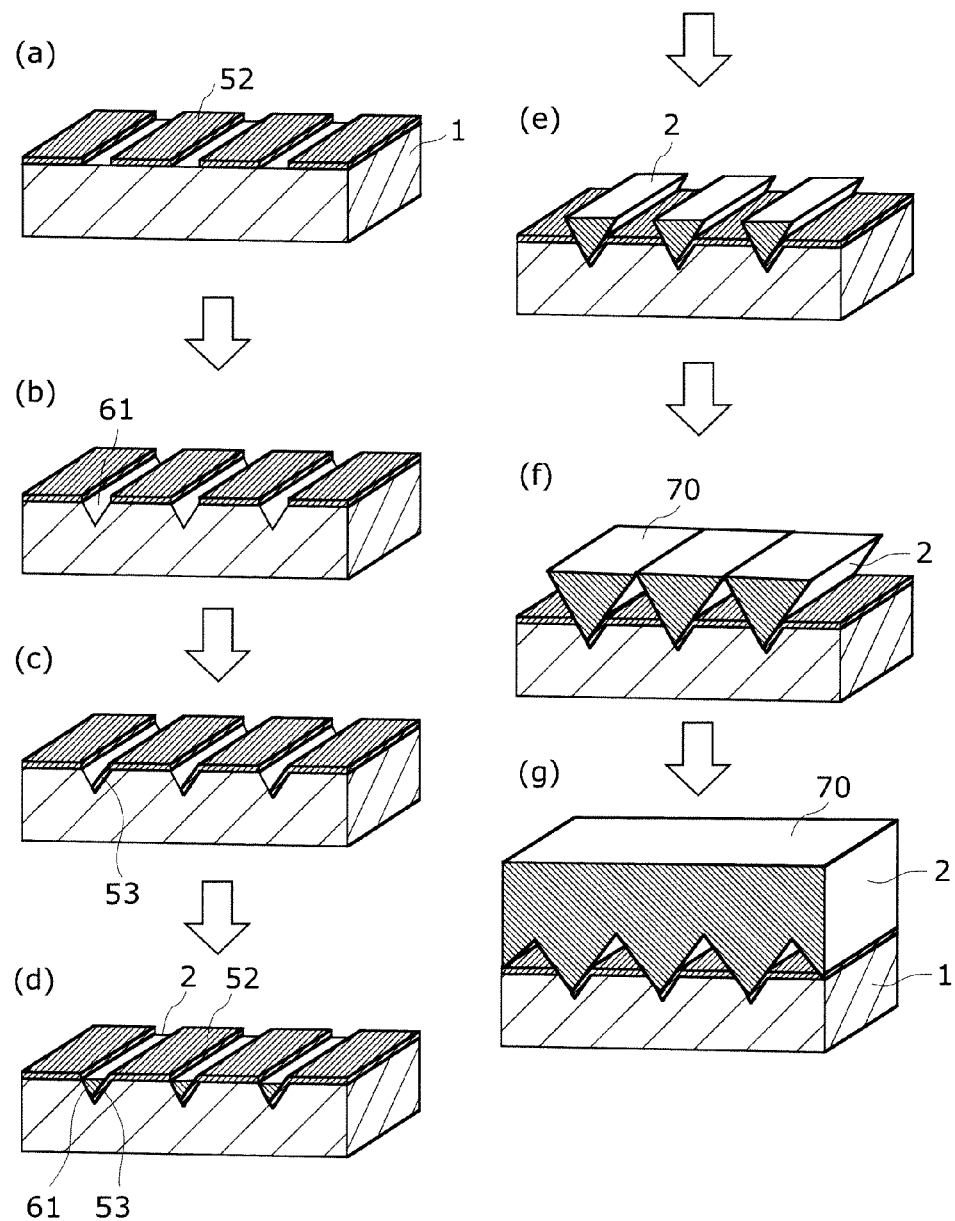
FIG. 18 shows schematic cross-sectional views of a conventional nitride semiconductor light emitting device in processes of a conventional manufacturing method.

With reference to FIGS. 17A to 17C, descriptions are given of nitride semiconductor light emitting devices according to Embodiments 3 and 7 of the present invention. FIG. 17A is an illustration for explaining an application example of a nitride semiconductor light emitting device according to a comparison example. FIG. 17B is an illustration for explaining a first application example of the nitride semiconductor light emitting device according to Embodiment 3 of the present invention. FIG. 17C is an illustration for explaining a second application example of the nitride semiconductor light emitting device according to Embodiment 7 of the present invention. In the drawings, the same structural elements are assigned with the same numerical references.

As shown in FIG. 17A, the application example of the nitride semiconductor light emitting device according to the comparison example is to use light sources that are three light emitting diodes (LED) which emit light in the red, green, and blue regions as light sources for a small projector. In the application example of the nitride semiconductor light emitting device according to the comparison example, as shown in FIG. 17A, the blue light emitted from the blue LED light source 981, the green light emitted from the green LED light source 982, and the red light emitted from the red LED light source 983 pass through a collimate lens 984, a collimate lens 985, and a collimate lens 986, respectively, and then pass through a mirror 987, a mirror 988, a mirror 989, respectively. The blue, green, and red light then pass through a polarizer 990, a liquid crystal panel 991, a polarizer 992, and a group of projector lenses 993, and is finally projected as an image.

Next, as shown in FIG. 17B, the first application example according to this embodiment is to use the nitride semiconductor light emitting device 300 according to Embodiment 3 and a red LED light source 983 as light sources for a small projector. As shown in FIG. 17B, the nitride semiconductor light emitting device 300 according to the first application example can emit blue light and green light at narrow light emission intervals. Accordingly, the blue light and green light emitted from the nitride semiconductor light emitting device 300 pass through a collimate lens 984, a mirror 989, a polarizer 990, a liquid crystal panel 991, a polarizer 992, and a group of projector lenses 993, and then is finally projected as an image. In this way, it is possible to achieve a simple optical system compared to the comparison example shown in FIG. 17A. In this application example, the nitride semiconductor light emitting device 300 according to Embodiment 3 is used, but any one of the nitride semiconductor light emitting devices according to Embodiments 4 to 6 and 8 may be used instead.

Next, as shown in FIG. 17C, the second application example according to this embodiment is to use the nitride semiconductor light emitting device 700 according to Embodiment 7 as a light source for a small projector. As shown in FIG. 17C, the nitride semiconductor light emitting device 700 according to the second application example can emit blue light, green light, and red light at narrow light emission intervals. Accordingly, the blue light, green light, and red light emitted from the nitride semiconductor light emitting device 700 pass through a collimate lens 986, a polarizer 990, a liquid crystal panel 991, a polarizer 992, and a group of projector lenses 993, and is then finally projected as an image. In this way, it is possible to achieve a simple optical system compared to the comparison example in FIG. 17A and the application example in FIG. 17B.

The nitride semiconductor light emitting elements and methods of manufacturing the same described in the above embodiments of the present invention are exemplary, and thus the present invention is not limited to the exemplary embodiments. Those skilled in the art will readily appreciate that many modifications are possible in the exemplary embodiments and variations of the exemplary embodiments are also possible without materially departing from the novel teachings and advantages of the present invention. Accordingly, all such modifications and variations are intended to be included within the scope of the present invention.

INDUSTRIAL APPLICABILITY

The present invention is applicable to light sources used for various kinds of display apparatus and lighting apparatuses, and is also applicable to the other light emitting apparatuses.

The invention claimed is:

1. A nitride semiconductor light emitting device comprising:
   an uneven substrate having an uneven structure in which a recess is formed;
   a first nitride semiconductor layer of a first conductive type formed on the uneven structure;
   a first light emitting layer formed on the first nitride semiconductor layer; and
   a second nitride semiconductor layer of a second conductive type formed on the first light emitting layer, the second conductive type being different from the first conductive type,
   wherein the recess has a bottom having a heat expansion coefficient larger than a heat expansion coefficient of the first nitride semiconductor layer,
   the uneven substrate includes a first substrate comprising silicon, an insulating layer formed on the first substrate, and a second substrate comprising silicon formed on the insulating layer,
   the recess is an opening formed in the second substrate such that the bottom of the recess is part of a surface of the insulating layer, and
   the recess has a side surface having a plane direction different from a plane direction of a main surface of the second substrate.

2. The nitride semiconductor light emitting device according to claim 1, wherein the side surface of the recess is a (111) silicon plane.

3. The nitride semiconductor light emitting device according to claim 1, wherein the main surface of the second substrate is one of (i) a seven-degree off-oriented plane which is oriented off by seven degrees from a (100) silicon plane, (ii) a (311) silicon plane, (iii) a (110) silicon plane, and (iv) a (112) silicon plane.

4. The nitride semiconductor light emitting device according to claim 1, wherein the first nitride semiconductor layer has a planar top surface.

5. The nitride semiconductor light emitting device according to claim 1, wherein the first substrate has a main surface which is a (100) silicon plane.

6. The nitride semiconductor light emitting device according to claim 1, wherein the uneven substrate has, as the uneven structure, a periodic structure in which recesses and protrusions are arranged at regular intervals.

7. A nitride semiconductor light emitting device comprising:
   an uneven substrate having an uneven structure in which a recess is formed;
   a first nitride semiconductor layer of a first conductive type formed on the uneven structure;
   a first light emitting layer formed on the first nitride semiconductor layer; and
   a second nitride semiconductor layer of a second conductive type formed on the first light emitting layer, the second conductive type being different from the first conductive type,
   wherein the recess has a bottom having a heat expansion coefficient larger than a heat expansion coefficient of the first nitride semiconductor layer,
   the uneven substrate has a first area having the uneven structure and a second area having a planar surface,
   a first nitride semiconductor stack is formed on the first area, the first nitride semiconductor stack including the first nitride semiconductor layer, the first light emitting layer, and the second nitride semiconductor layer, a second nitride semiconductor stack is formed on the second area, the second nitride semiconductor stack including a third nitride semiconductor layer of the first conductive type, a second light emitting layer, and a fourth nitride semiconductor layer of the second conductive type, the second nitride semiconductor stack has a main surface whose plane direction is different from a plane direction of a main surface of the first nitride semiconductor stack, and the second light emitting layer emits light having a wavelength longer than a wavelength of light emitted from the first light emitting layer.

8. The nitride semiconductor light emitting device according to claim 7, wherein the first area and the second area are separated by an insulating layer.

9. The nitride semiconductor light emitting device according to claim 7, wherein each of the first area and the second area comprises a silicon single crystal.

10. The nitride semiconductor light emitting device according to claim 7, wherein a protrusion in the uneven structure in the first area has at least two side surfaces, one of the at least two side surfaces of the protrusion is a (100) silicon plane, and the other side surface of the protrusion is covered with a predetermined mask.

11. The nitride semiconductor light emitting device according to claim 7, wherein the uneven substrate is a sapphire substrate having a main surface which is a (11-20) plane.

12. The nitride semiconductor light emitting device according to claim 7, wherein at least one of the second nitride semiconductor layer and the fourth nitride semiconductor layer includes an uneven structure.

13. The nitride semiconductor light emitting device according to claim 7, further comprising:

a third nitride semiconductor stack formed on the uneven substrate, the third nitride semiconductor stack including a fifth nitride semiconductor layer of the first conductive type, a third light emitting layer, and a sixth nitride semiconductor layer of the second conductive type, wherein the third light emitting layer emits light having a wavelength different from wavelengths of light emitted from the first light emitting layer and light emitted from the second light emitting layer.

14. A method of manufacturing a nitride semiconductor light emitting device, the method comprising:

forming an uneven substrate having an uneven structure in which a recess is formed;

forming a first nitride semiconductor layer of a first conductive type on the uneven structure;

forming a first light emitting layer on the first nitride semiconductor layer; and forming a second nitride semiconductor layer of a second conductive type on the light emitting layer, the second conductive type being different from the first conductive type, wherein the recess has a bottom having a heat expansion coefficient larger than a heat expansion coefficient of the first nitride semiconductor layer, the forming of an uneven substrate includes:

forming, on a first substrate comprising silicon, (i) an insulating layer part of which is a bottom of the recess and (ii) a second substrate comprising silicon; and forming the recess having a side surface whose plane direction is different from a plane direction of a main surface of the second substrate, by partly removing the second substrate to expose the insulating layer; and forming, in the forming of a first nitride semiconductor layer, the first nitride semiconductor layer on the side surface of the recess.

15. The method of manufacturing a nitride semiconductor light emitting device, according to claim 14, wherein the side surface of the recess is a (111) silicon plane.

16. The method of manufacturing a nitride semiconductor light emitting device, according to claim 14, the method further comprising:

bonding a third substrate to the second nitride semiconductor layer; and removing the first substrate, the insulating layer, and the second substrate.

17. A method of manufacturing a nitride semiconductor light emitting device, the method comprising:

forming an uneven substrate having an uneven structure in which a recess is formed;

forming a first nitride semiconductor layer of a first conductive type on the uneven structure;

forming a first light emitting layer on the first nitride semiconductor layer; and forming a second nitride semiconductor layer of a second conductive type on the light emitting layer, the second conductive type being different from the first conductive type, wherein the recess has a bottom having a heat expansion coefficient larger than a heat expansion coefficient of the first nitride semiconductor layer, the forming of an uneven substrate includes:

forming, on a first substrate comprising a silicon single crystal, (i) an insulating layer and (ii) a second substrate comprising a silicon single crystal and having a main surface whose plane direction is different from a plane direction of a (111) silicon plane; and forming a protrusion having a first side surface which is the (111) silicon plane, by partly removing the second substrate to expose the insulating layer, the method further comprising:

forming a predetermined mask that covers a second side surface which is other than the first side surface among the side surfaces of the protrusion, the forming being performed between the forming of an uneven substrate and the forming of a first nitride semiconductor layer;

partly removing the insulating layer to expose the first substrate;

forming a third nitride semiconductor layer of the first conductive type on the exposed first substrate;

forming a second light emitting layer on the third nitride semiconductor layer; and forming a fourth nitride semiconductor layer of the second conductive type on the second light emitting layer.

18. The method of manufacturing a nitride semiconductor light emitting device, according to claim 17, further comprising:

bonding a third substrate to the second nitride semiconductor layer and the fourth nitride semiconductor layer; and removing the first substrate, the insulating layer, and the second substrate.

19. A method of manufacturing a nitride semiconductor light emitting device, the method comprising:

forming an uneven substrate having an uneven structure in which a recess is formed;

forming a first nitride semiconductor layer of a first conductive type on the uneven structure;
forming a first light emitting layer on the first nitride semiconductor layer; and
forming a second nitride semiconductor layer of a second conductive type on the light emitting layer, the second conductive type being different from the first conductive type,
wherein the recess has a bottom having a heat expansion coefficient larger than a heat expansion coefficient of the first nitride semiconductor layer,
the forming of an uneven substrate is forming the uneven structure having a side surface which is a (0001) plane, in an area on a sapphire substrate having a main surface which is a (11-20) plane,
the method further comprising:
forming a third nitride semiconductor layer of the first conductive type on the main surface of the sapphire substrate;
forming a second light emitting layer on the third nitride semiconductor layer; and
forming a fourth nitride semiconductor layer of the second conductive type on the second light emitting layer.

* * * * *